United States Patent [19]

Kobayashi et al.

[11] Patent Number: 4,945,383
[45] Date of Patent: Jul. 31, 1990

[54] IMAGE FORMING APPARATUS

[75] Inventors: Atsushi Kobayashi; Takashi Suzuki; Yasuhiko Kosugi, all of Suwa, Japan

[73] Assignee: Seiko Epson Corporation, Tokyo, Japan

[21] Appl. No.: 370,969

[22] Filed: Jun. 26, 1989

Related U.S. Application Data

[63] Continuation-in-part of Ser. No. 149,815, Jan. 29, 1988, Pat. No. 4,860,058.

[30] Foreign Application Priority Data

Feb. 2, 1987 [JP] Japan .................. 62-22006
Mar. 3, 1987 [JP] Japan .................. 62-48275
Apr. 30, 1987 [JP] Japan .................. 62-107702

[51] Int. Cl.$^5$ .................................. G03B 27/52
[52] U.S. Cl. ............................ 355/30; 355/27; 355/35; 355/77; 430/138
[58] Field of Search .......... 355/30, 27, 32, 35, 355/77; 430/138, 403, 404, 131

[56] References Cited

U.S. PATENT DOCUMENTS

| | | | |
|---|---|---|---|
| 3,396,650 | 8/1968 | Rubenstein | 354/304 |
| 4,149,887 | 4/1979 | Levy | 430/138 |
| 4,365,018 | 12/1982 | Crutchfield et al. | 430/139 |
| 4,399,209 | 8/1983 | Sanders et al. | 430/138 |
| 4,440,846 | 4/1984 | Sanders et al. | 430/138 |
| 4,482,624 | 11/1984 | Arney et al. | 430/138 |
| 4,508,807 | 4/1985 | Adair | 430/138 |
| 4,554,235 | 11/1985 | Adair et al. | 430/138 |
| 4,576,891 | 3/1986 | Adair et al. | 430/138 |
| 4,578,339 | 3/1986 | Adkins | 430/138 |
| 4,587,194 | 5/1986 | Adair et al. | 430/138 |
| 4,600,678 | 7/1986 | Adair et al. | 430/138 |
| 4,770,972 | 9/1988 | Nelson et al. | 430/131 |
| 4,860,058 | 8/1989 | Kobayashi et al. | 355/27 |
| 4,864,356 | 9/1989 | Asano et al. | 355/30 |

FOREIGN PATENT DOCUMENTS 306510 7/1972 Sweden.
321719 4/1975 Sweden.
1297129 11/1973 United Kingdom.

*Primary Examiner*—Richard A. Wintercorn
*Attorney, Agent, or Firm*—Blum Kaplan

[57] ABSTRACT

An image forming apparatus includes a temperature control device for controlling the temperature of light sensitive microcapsules on a photosensitive medium which are pressed against a transfer medium to transfer a latent image from the photosensitive medium to the transfer medium. A pressure developing device is employed which generates a load only during that period when the image is being developed on the receiving medium. The temperature control device range prevents the ambient temperature from adversely affecting the light sensitive microcapsules prior to exposure to light.

33 Claims, 13 Drawing Sheets

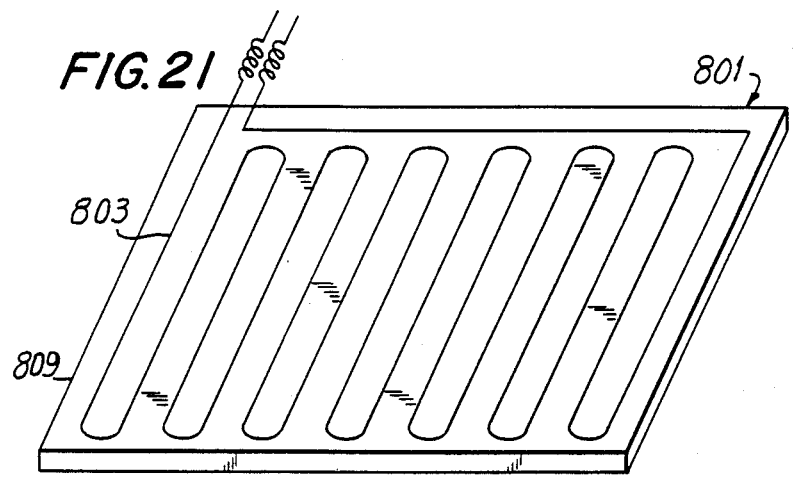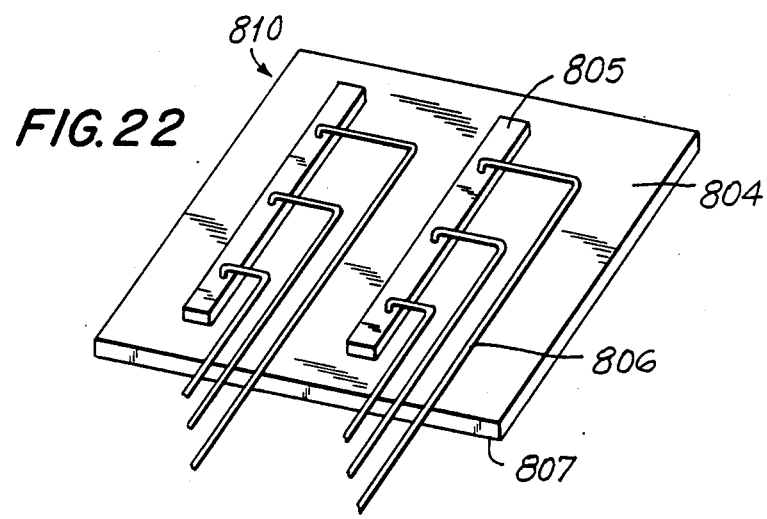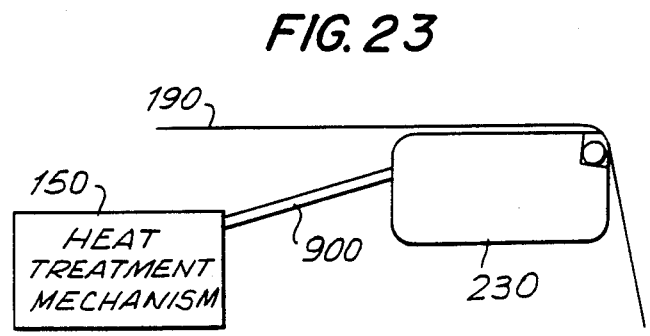

IMAGE FORMING APPARATUS

CROSS-REFERENCE TO RELATED APPLICATION

This application is a continuation-in-part of U.S. patent application Ser. No. 07/149,815, filed on Jan. 29, 1988 now U.S. Pat. No. 4,860,058 issued Aug. 22, 1989.

BACKGROUND OF THE INVENTION

This invention relates generally to an image forming apparatus, and more particularly to an image forming apparatus including a temperature control device to regulate the temperature of a photosensitive medium on which the image is formed.

Generally, printers and copiers use an electrophotographic or silver halide photographic process in which an image is formed on a photosensitive medium. Both the electrophotographic and silver halide photographic processes, however, suffer from several drawbacks.

Copiers and printers in which the electrophotographic process is used generally produce copies having poor tonal quality especially for intermediate tones. Such poor tonal quality is due, in part, to the photosensitive medium being repeatedly exposed to toner transfer and fixing for the yellow, magenta, and cyan colors. The repeated exposure, transfer and fixing of these three color toners can result in an undesirable offset of the image, that is, multiple colored images formed on the transfer medium (e.g. sheet of paper).

To prevent offset, printers and copiers using the electrophotographic process attempt to provide a high degree of precision in the paper feed path of the transfer medium. Printers and copiers with such precision are both large in size and costly to manufacture. The tendency of the transfer medium to become displaced during its path of travel within the printer or copier resulting in offset of the image is difficult to eliminate regardless of the size of the printer or copier.

Materials involved in silver halide photography are not easily handled due to the wet developing process employed. Silver halide photographic processing also generates an offensive odor and requires disposal of the waste solution. The need to use expensive silver halide paper results in an undesirable high operating cost. Silver halide photographic processing also involves a number of complicated steps which increase production costs and require the use of equipment of large size and weight.

Another type of printer or copier (hereinafter referred to as an image forming apparatus) includes a photosensitive medium on which a latent image is formed. The photosensitive medium has a plurality of microcapsules uniformly distributed over a surface of a substrate. Each microcapsule has a diameter of several micrometers and contains dye precursors of either red, green or blue and photosetting substances. The photosetting substance for each microcapsule reacts in response to exposure to the wavelength of light corresponding to the same color as its dye precursor. After exposure to the multicolored light of the image, the microcapsules may remain unaffected by the light or may harden or soften more or less in accordance with the wavelength(s) of the light. The microcapsules not sufficiently hardened are broken partially or completely by pressure exerted by a pair of pressure rollers. The dye precursor from each broken microcapsule escapes and reacts with a developer coated on the surface of the transfer medium to form a color image on the latter.

The colored image produced on the transfer medium has a high resolution of about 100 dots/millimeters. Individual sheets of paper are typically used as the transfer medium. If desired, the image forming apparatus can provide a monochromatic rather than a panchromatic image on the transfer medium.

Since the three different types of microcapsules (i.e. those having red, green or blue dye precursors) are exposed simultaneously, the photosensitive medium need be exposed only once to light representative of the multicolored image. Therefore, the repeated exposure, transfer and fixing of the image required for electrophotographic type copiers and printers is unnecessary. Paper production costs associated with image forming apparatus are considerably lower as compared to copiers or printers using electrophotographic or silver halide photography. Development of the image on the transfer medium is effected using a dry process rather than a wet process as required by silver halide photography. Unfortunately, commercially available image forming apparatus also have several drawbacks.

More specifically, the optical density of the latent image formed on the photosensitive medium is quite sensitive to changes in the level of intensity of light striking the photosensitive medium. Consequently, only a narrow dynamic range of exposure energy levels is available for use. In particular, the range of exposure energy levels for color development (i.e. hardening or softening) of the microcapsules at intermediate tones is relatively small. Therefore, when the photosensitive medium is exposed to a wide range of light energy levels representative of the image to be reproduced, the gradual passing from one tint or shade to another (i.e."-gradation") of the colored image cannot be accurately reproduced.

Conventional image forming apparatus are also unable to reproduce a colored image with hues of high fidelity. The inability to reproduce colored images of high fidelity stems 1 from the maximum and minimum levels of light energy used for forming the latent image on the photosensitive medium being dependent upon the wavelengths of light used.

When exposing the photosensitive medium to light only light representative of the image is used. The photosensitive medium is not exposed to light outside its image forming region. When the photosensitive medium and transfer medium are pressed against one another by the pair of pressure developing rollers, the microcapsules outside the image forming region, that is, in the unexposed region of the photosensitive medium are crushed causing unnecessary and undesirable color development on the transfer medium. Therefore, an overall degraded appearance in the image on the transfer medium is created.

The liquid component flowing from the crushed microcapsules especially in the unexposed region of the photosensitive medium causes the transfer medium and photosensitive medium to adhere to each other. Separation of the photosensitive medium from the transfer medium during the subsequent separation process is difficult. In the event that only the photosensitive medium and not the transfer medium is placed between and crushed by the pair of pressure developing rollers, the contents of the unset (i.e. unhardened) microcapsules in the unexposed region of the photosensitive medium will adhere to the rollers and other elements of the apparatus. Performance of the apparatus deteriorates as a consequence thereof.

Adherence of the photosensitive medium to the pair of pressure rollers can be avoided by applying pressure to the photosensitive medium only when the transfer medium is also present between the pair of rollers. The pair of pressure rollers are, at all other times, separated from each other. The leading and trailing edge portions of the transfer medium, however, cannot be pressed against the photosensitive medium. Furthermore, since the pressure developing operation is typically carried out by a pair of cylindrical rollers, the boundaries at the leading and trailing edges of the image formed on the transfer medium are blurred resulting in an unattractive and unacceptable finished reproduction.

Ambient temperatures also can adversely affect the quality of the reproduced image. More particularly, at high or low ambient temperatures the light sensitive properties are adversely changed which can significantly lower the quality of the image which is reproduced.

Accordingly, it is desirable to provide an image forming apparatus using a photographic process which produces an image of high tonal quality. The photographic process should also produce clean, clear color images on a transfer medium, avoid the need to dispose of waste solution, eliminate the generation of offensive odors, reduce operating costs and be housed within a relatively lightweight and small sized apparatus. The image forming apparatus should provide an acceptable gradation of the image with hues of high fidelity, prevent unnecessary color development on the transfer medium, substantially reduce adherence of the photosensitive medium to the transfer medium and maintain the ambient temperature surrounding the unexposed photosensitive medium within a range which will not adversely affect the light sensitive properties of the microcapsules.

The apparatus should prevent the contents of the unset microcapsules from adhering to the rollers and other elements of the apparatus. It is also desirable to provide an image forming apparatus which avoids reproducing images having blurred leading and trailing edges.

SUMMARY OF THE INVENTION

Generally speaking, in accordance with the invention, an image forming apparatus includes a temperature control device for maintaining the temperature of light sensitive microcapsules on a photosensitive medium, each microcapsule including an optically hardening or softening agent and a color former which when pressured against a transfer medium after exposure to light forms an image on the transfer medium.

The temperature control apparatus maintains the ambient temperature surrounding the photosensitive medium within a suitable range prior to and during exposure to light. The light sensitive properties of the photosensitive medium are not exposed to high and low ambient temperatures which can adversely affect the quality of the reproduced image.

The apparatus also includes an exposure mechanism which subjects a first predetermined region of the photosensitive medium to exposure of light representative of an image and a second predetermined region of the photosensitive medium to light nonrepresentative of the image. The image formed in the first predetermined region of the photosensitive medium is typically of a document to be reproduced and is referred to herein as an image forming region of the photosensitive medium. The image formed in the second predetermined region of the photosensitive medium is of a white border surrounding the image of the document to be reproduced. This second predetermined region also can be viewed as a nonimage (of the document) forming region of the photosensitive medium.

By exposing the second predetermined region of the photosensitive medium to light, the microcapsules therein are hardened and therefore are not crushed during the subsequent pressure development process. Consequently, unnecessary color development occurring outside the first predetermined region and blurring of the perimeter of the first predetermined region are prevented.

The exposure mechanism also subjects the first predetermined region of the photosensitive medium to exposure of light representative of the image of the document and of light having a uniform intensity. The separate steps of exposing the first predetermined region to light representative of the image and to light having a uniform intensity results in the reproduction of a colored image on the photosensitive medium having excellent gradation and hues with high fidelity.

An illuminating mechanism provides indirect lighting for illuminating the first predetermined region of the photosensitive medium. Illumination of the second predetermined region of the photosensitive medium is provided either directly or indirectly by the illuminating mechanism in accordance with alternative embodiments of the invention.

Other features of the invention include a control system for controlling the uniform intensity of the light striking the photosensitive medium, a color temperature filter for adjusting the color temperature of light traveling towards the photosensitive medium and a color adjusting filter for adjusting the spectral distribution of light traveling towards the photosensitive medium.

Accordingly, it is an object of this invention to provide an improved image forming apparatus which produces a clear, clean and high resolution image having excellent color reproductivity and high tonal quality.

Another object of the invention is to provide an improved image forming apparatus which is not adversely affected by high and low ambient temperatures.

A further object of the invention is to provide an image forming apparatus in which the ambient temperature surrounding the photosensitive medium prior to and during exposure to light is maintained within a predetermined range.

Still other objects and advantages of the invention will in part be obvious and will in part be apparent from the specification.

The invention accordingly comprises the several steps and the relation of one or more of such steps with respect to each of the others, and the apparatus embodying features of construction, combinations of elements and arrangements of parts which are adapted to affect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanied drawings, in which:

FIG. 21 is a perspective view of a heating device in accordance with one embodiment of the invention;

FIG. 22 is a perspective view of a cooling unit; and

FIG. 23 is a diagrammatic view of a heating device in accordance with an alternative embodiment of the invention.

DESCRIPTION OF THE PREFERRED EMBODIMENTS

Figure 1:
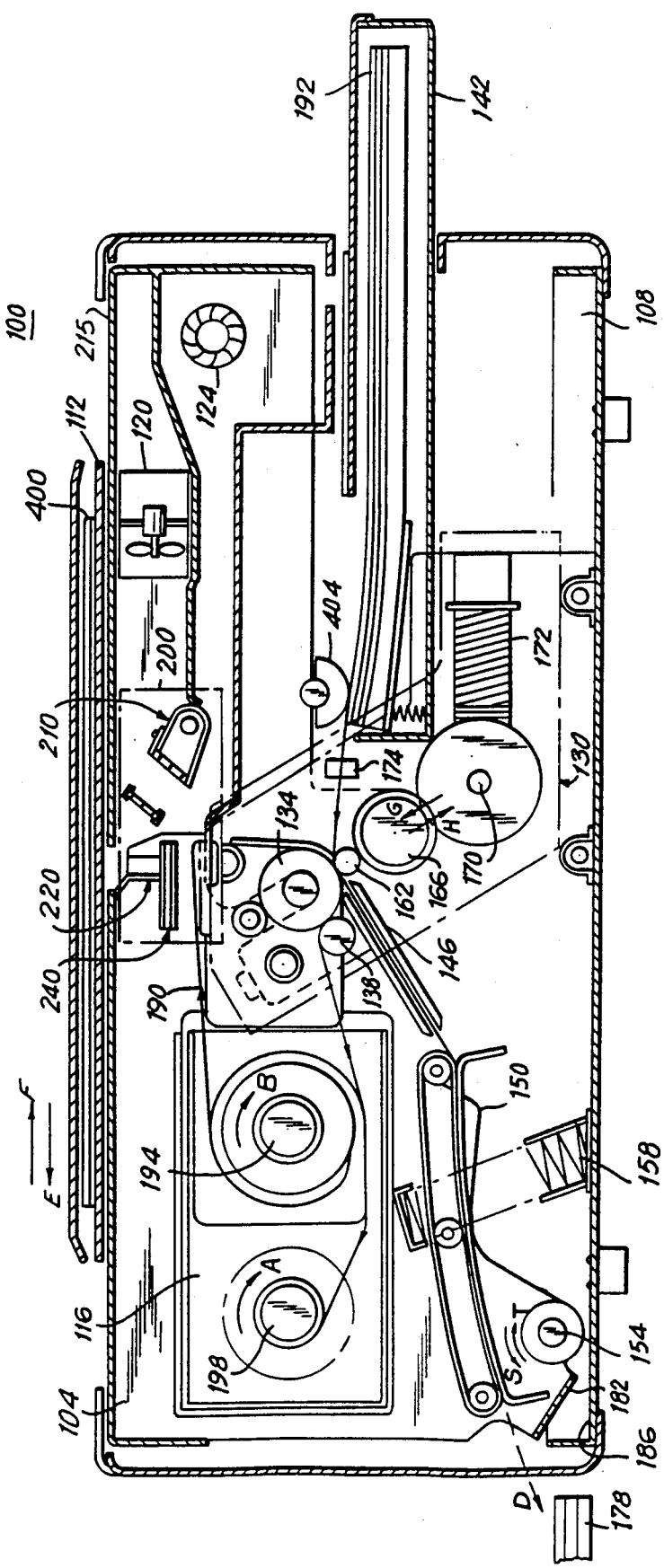
FIG. 1 is a front elevational view of an image forming apparatus constructed in accordance with one embodiment of the invention.

Referring to FIG. 1, an image forming apparatus such as, but not limited to a copier, shown generally as 100 constructed and arranged in accordance with the invention includes an upper frame 104 and a lower frame 108 pivotably connected together by a pivot shaft 154 in a clam shell construction. Lower frame 108 normally is maintained in a stationary position with upper frame 104 being pivoted in order to open and close apparatus 100.

Included on upper frame 104 are a transparent plate 112, a photosensitive medium cassette 116, an optical system 200, and a pair of air cooling fans 120 and 124. A portion of a pressure developing mechanism 130 which includes an upper pressure roller 134 and an additional pressure roller 138 are also connected to upper frame 104.

Included on lower frame 108 are a transfer medium cassette 142, a separating device 146, a heat treating mechanism 150, pivot shaft 154 and a spring 158. Also included on lower frame 108 is the remainder of pressure developing mechanism 130, that is, an intermediate pressure roller 162, a lower pressure roller 166, a force application shaft 170 a force application spring 172 and a detector 174. An output image tray 178 for receiving sheets of a transfer medium 192 is also connected to lower frame 108.

Upper frame 104 and lower frame 108 are connected together through pivot shaft 154 so that upper frame 104 is able to pivot to open in a counterclockwise direction as indicated by arrow S and to close in a clockwise direction as indicated by arrow T. Spring 158 presses against upper frame 104 so as to urge the latter in an upwardly direction (i.e. in the direction of arrow S) and aide in the opening of apparatus 100. Upper frame 104 may be pivoted in the direction of arrow S until a foot portion 182 of upper frame 104 comes into contact with and rests upon a bottom surface 186 of lower frame 108. Upper frame 104 is supported and may be maintained in the open position for repair and routine maintenance and the like.

A photosensitive medium 190 is stretched between and forms a continuous roll between a supply shaft 194 and a take-up shaft 198. Photosensitive medium 190 is fed from supply shaft 194 to take-up shaft 198 in a direction denoted by an arrow. Transfer medium 192, which is in the form of sheets of paper or the like having a predetermined uniform size, is stacked within transfer medium cassette 142.

Operation of apparatus 100 is as follows: An original document 400 is initially placed at a predetermined position on plate 112, the latter of which is movable in linear reciprocating directions denoted by a pair of arrows E and F shown in FIG. 2 Plate 112 is moved to a start position and stops momentarily before moving once again. At the same time, supply shaft 194 rotates in a direction denoted by an arrow B and take-up shaft 198 rotates in a direction denoted by an arrow A.

Figure 2:
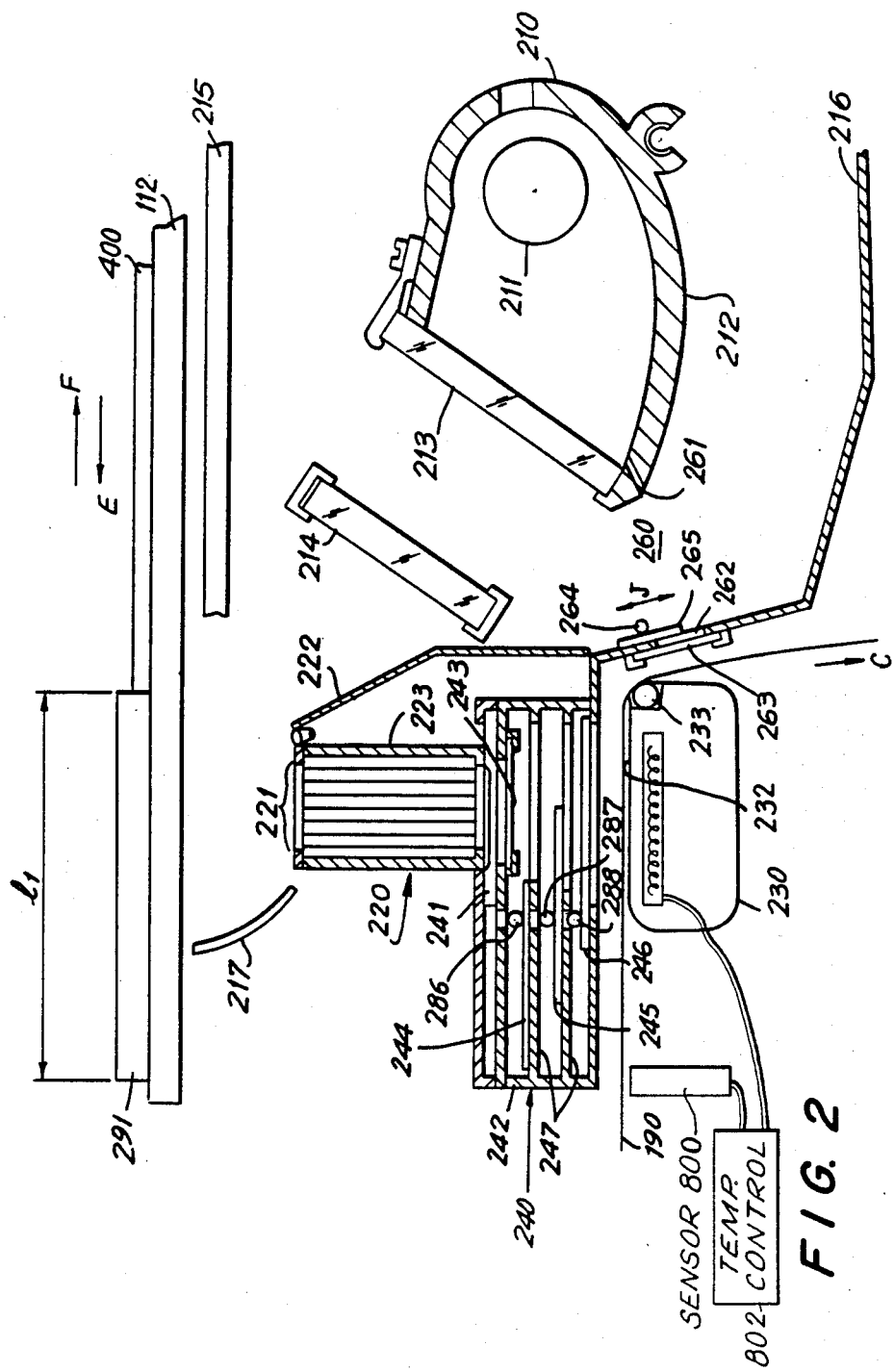
FIG. 2 is a side elevational view of an exposure mechanism, an illuminating mechanism and fragmented sections of other portions of the apparatus of FIG. 1.

Referring to FIG. 2, a portion of photosensitive medium 190, which corresponds to the desired size of an image to be formed, is advanced at the same speed as the speed at which plate 112 passes over an exposure plate 230 of optical system 200. When original document 400 and photosensitive medium 190 pass over exposure plate 230 at the same speed, light from a halogen lamp 211 is concentrated by a reflector 212, and travels through a heat ray reflecting shutter (not shown). The heat ray reflecting shutter aides in the ventilation created by fans 120 and 124 and reflects part of the heat energy generated by halogen lamp 211. The light then travels through a heat ray absorbing filter 213 to prevent the heat energy from halogen lamp 211 from being directly applied to document 400 and is directed toward document 400 through a heat ray absorbing filter 214 to illuminate document 400. Light passing through heat ray absorbing filter 214 is also reflected toward document 400 by a concave mirror 217.

Light is reflected from document 400 towards photosensitive medium 190 and passes through an image forming lens system 220 and a color adjusting mechanism 240 (i.e. compensating filter unit) to form a partially reproduced image of original document 400 on photosensitive medium 190. Successive portions of photosensitive medium are exposed in a similar manner. The foregoing operation ensures that a predetermined region of photosensitive medium 400 is exposed to light representative of the image to be reproduced. Additionally, the hardening and/or softening of the microcapsules which form the latent image on photosensitive medium 190 can be easily controlled.

Referring once again to FIG. 1, uppermost sheet 192 in a stack of transfer medium sheets is drawn out by the operation of a pick-up roller 404 as photosensitive medium 190 is being exposed to the reflected light representative of the image to be reproduced. Uppermost sheet 192 is then transported by a transport system (not shown) in a direction of an arrow D so that uppermost sheet of transfer medium 192 can be laid on exposed photosensitive medium 190. Photosensitive medium 190 and transfer medium 192 are laid upon one another at the time they enter or prior to entering pressure developing mechanism 130.

Immediately after a detector 174 detects that the leading edge of transfer medium 192 has been fed into the area between upper pressure roller 134 and intermediate pressure roller 162, pressure development is initiated by intermediate pressure roller 162 moving towards upper pressure roller 134 so as to press transfer medium 192 against exposed photosensitive medium 190. Similarly, immediately before the trailing edge of transfer medium 192 exits from the area between upper pressure roller 134 and intermediate pressure roller 162, intermediate pressure roller 162 moves downwardly (i.e. away from upper pressure - roller 134) to prevent transfer medium 192 from being pressed against photosensitive medium 190.

Intermediate pressure roller 162 has a relatively small diameter compared to lower pressure roller 166 and is in contact with and supported by lower pressure roller 166 during pressure development. Deformation of intermediate pressure roller 162 is thereby suppressed during pressure development. During those periods in which pressure development is not being carried out, intermediate pressure roller 162 is separated from upper pressure roller 134 by more than the combined thicknesses of photosensitive medium 190 and transfer medium 192 so as to prevent intermediate pressure roller 162 from exerting any pressure against transfer medium 192 and/or photosensitive medium 190.

The level of pressure which is required to crush the microcapsules of photosensitive medium 190 is generated by the pressure exerted by intermediate pressure roller 162 and upper pressure roller 134. Preferably, intermediate pressure roller 162 has a smaller diameter than that of upper pressure roller 134. The smaller diameter of intermediate pressure roller 162 provides a smaller surface area compared to the surface area of upper pressure roller 134 for exerting pressure. Therefore, intermediate pressure roller 162 exerts a greater level of pressure than upper pressure roller 134 in transferring the latent image from photosensitive medium 190 to transfer medium 192.

Upper pressure roller 134 and intermediate pressure roller 162 should not be positioned for pressing against photosensitive medium 190 and transfer medium 192 prior to receiving the leading edge of transfer medium 192 therebetween. Otherwise, insertion of transfer medium between upper pressure roller 134 and intermediate pressure roller 162 will be difficult. For this reason, as well as others noted herein, intermediate pressure roller 162 is operable for moving towards and away from upper pressure roller 134.

Movement of intermediate pressure roller 162 is controlled by the movement of lower pressure roller 166. A driving mechanism (not shown) is employed for moving lower pressure roller 166. Immediately after the leading edge of transfer medium 192 is fed into the area between upper pressure roller 134 and intermediate pressure roller 162, which is detected by detector 174, intermediate pressure roller 162 moves in a direction denoted by an arrow G (i.e. moves towards upper pressure roller 134). Lower pressure roller 166 holds intermediate pressure roller 162 in cooperation with upper pressure roller 134 to press against transfer medium 192 and photosensitive medium 190. Simultaneously, upper pressure roller 134 and intermediate pressure roller 162 rotate to advance transfer medium 192 and photosensitive medium 190. A colored image due to the dye precursors flowing from the crushed microcapsules of photosensitive medium 190 are thus transferred to transfer medium 192. Immediately before the trailing edge of transfer medium 192 exits from the area between upper pressure roller 134 and intermediate pressure roller 162, intermediate pressure roller 162 moves in a direction denoted by an arrow H and will remain in this lowered position until the next sheet of transfer medium 192 is detected by detector 174.

As photosensitive medium 190 and transfer medium 192 leave pressure developing mechanism 130, they are separated from each other by a separating device 146. Separating device 146 includes a separating member (not shown) made of resin material to aide in the separation process. Transfer medium 192 then passes through heat treating mechanism 150, which includes a heating section, to assist formation of the image on transfer medium 192, to stabilize the formed image on transfer medium 192 and to improve the quality of the image. Thereafter, transfer medium 192 is discharged to output image tray 178.

The exposed portion of photosensitive medium 190 which passes through the area between upper pressure roller 134 and intermediate pressure roller 162 next travels between upper pressure roller 134 and a secondary pressure roller 138 and is then advanced toward take-up shaft 198 in a direction denoted by arrow C. Rotation of take-up shaft 198, which is located within photosensitive medium cassette 116, is halted when the trailing edge of transfer medium 192 leaves the area between upper pressure roller 134 and intermediate pressure roller 162. Once rotation of take-up shaft 198 is halted, the image forming cycle is complete. Images are successively formed on transfer medium 192 by repeating the above described cycle.

As shown in FIG. 2, an optical system 200 includes six different sections, that is, an illuminating mechanism 210, an image forming lens system 220, an exposure plate 230, a color filtering unit 240, a uniform intensity device 260 and a white plate 291. Each of these sections of image system 200 will now be explained in greater detail.

Image forming lens system 220 includes a self focusing lens group 221 which controls and provides a correct or actual size reproduction of the image of original document 400 on the surface of photosensitive medium 190. Document 400 and white plate 291 are illuminated by illuminating mechanism 210 for forming an image in a predetermined region of photosensitive medium 190 (i.e. the image forming region) and for exposing regions other than the image forming region of photosensitive medium 190, respectively.

The surface of document 400, which is placed on plate 112, and the surface of photosensitive medium 190 having the microcapsules thereon are disposed at optically equal distances relative to self focusing lens group 221. Document 400 and photosensitive medium 190 are displaced in the same direction and at the same speed. Accordingly, the entire surface of document 400 can be scanned by illuminating mechanism 210 and a latent image of the entire surface of original document 400 is formed on photosensitive medium 190.

Illuminating mechanism 210 includes halogen lamp 211, reflector 212, heat ray reflecting filter 213 and heat ray absorbing filter 214. Halogen lamp 211 is a straight tube operating at a color temperature of between approximately 3000 degrees Kelvin to 3200 degrees Kelvin and at a rated power of approximately 800 watts. Reflector 212 has a substantially semieliptical cross sectional configuration which partially covers halogen lamp 211 to permit visible rays of light emitted from halogen lamp 211 to reach original document 400 efficiently. In addition to the visible rays of light emitted from halogen lamp 210 are infrared rays which are reflected and absorbed by heat ray reflecting filter 213 and heat ray absorbing filter 214, respectively. Heat ray absorbing filter 214 is spatially disposed in the middle of the optical path between illuminating mechanism 210 and the original illuminating position of document 400.

Plate 112 is disposed above an upper frame 215 of illuminating mechanism 200. When plate 112 is displaced in the operative direction of arrow E with the document 400 placed thereon, scanning of document 400 is effected. When scanning has been completed, plate 112 returns in the direction of arrow F to return plate 112 to its standby position as shown in FIG. 2.

Self focusing lens group 221 includes eight (8) rows of self focusing lenses. Each row includes approximately one hundred and twenty (120) elements 221 which are arranged in a direction perpendicular to the direction of movement of plate 112. Image forming lens system 220 is operable for properly focusing the light from document 400 having a size of approximately 210×297 millimeters on photosensitive medium 190. Self focusing lens group 221 is rigidly secured to a self focusing lens frame 223 which, in turn, is rigidly secured to a light shielding plate 222. Light shielding plate 222 has an interior surface which is coated with black paint or the like to prevent reflection of any light striking it.

Figure 3:
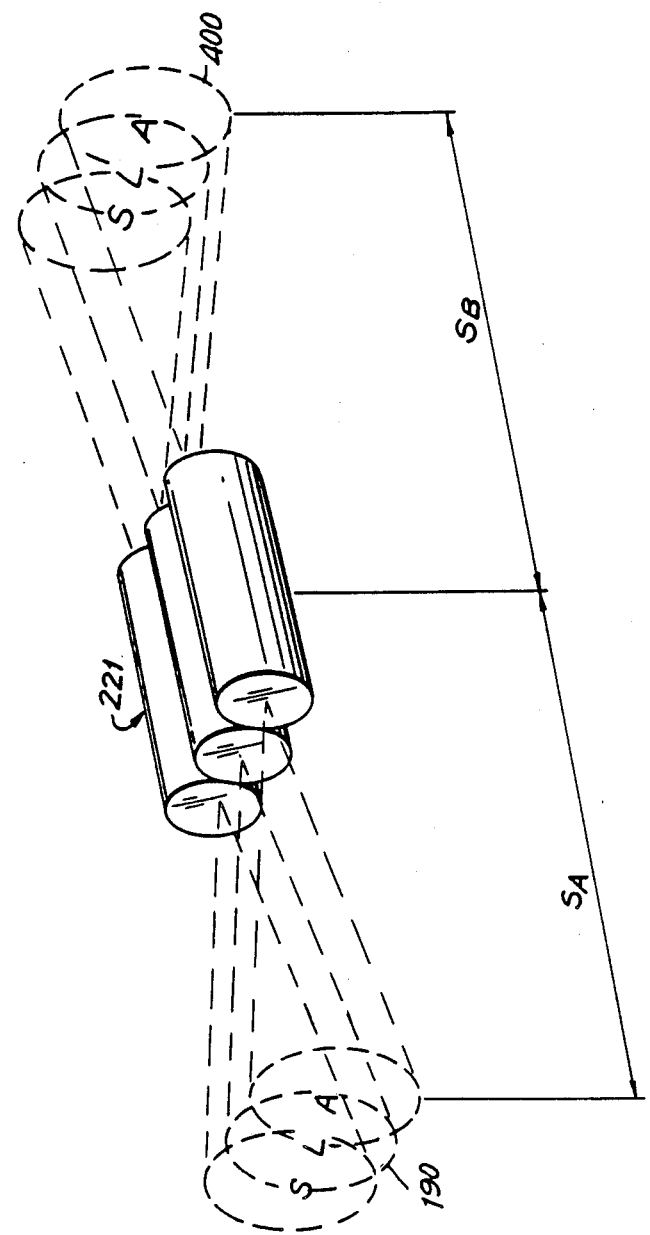
FIG. 3 is a diagrammatic perspective view of a self focusing lens group.

As shown in FIG. 3, self focusing lens group 221 is a lens system which forms a correct/actual size real image at a distance SA=SB. Since self focusing lens group 221 includes eight rows rather than a single row of elements, a reduction in the quantity of light required to be generated by halogen lamp 211 is possible. The reduction in the quantity of light is due to eight times the amount of light being theoretically available for focusing onto photosensitive medium 190 compared to a self focusing lens group having only a single row of elements. Increasing the number of rows of self focusing lens 221 to ten (10) or more, however, does not further enhance the effectiveness of self focusing lens group 221. Such ineffectiveness is due to the outermost row(s) of elements being outside the range of light rays emitted from and concentrated by illuminating mechanism 210.

As viewed from FIG. 2, a detecting roller 233 is rotatably supported in an upper right corner of exposure plate 230 and is in contact with photosensitive medium 190. Rotation of detecting roller 233 corresponds to the distance travelled by photosensitive medium 190 past detecting roller 233. A rotary encoder (not shown) is attached to one end of detecting roller 233 for measuring the amount of rotation by detecting roller 233 and therefore the distance travelled by photosensitive medium 190 beyond detecting roller 233.

A light shielding plate 241 is slidably movable to permit the rays of light from image forming lens system 220 to pass therethrough or to intercept the light therefrom by action of a plunger (not shown). In order to shield the rays of light from image forming lens system 220, lens shielding plate 241 is disposed under image forming lens system 220 and on the upper surface of a filter casing 242.

Exposure plate 230 is disposed beneath photosensitive member 190 so as to maintain the distance of SB from self focusing lens group 221. The surface of exposure plate 23 is formed using a white plastic plate having substantially no deflection. Rather, substantially all light striking exposure plate 230 which passes through photosensitive medium 190 is reflected back towards photosensitive medium 190. A surface 232 which faces photosensitive medium 190 of exposure plate 230 is provided with a multiplicity of grooves slightly slanted in the direction of advancement by photosensitive medium 190. These multiplicity of grooves are required to prevent photosensitive medium 190 from becoming caught on the surface of exposure plate 230 as photosensitive medium 190 passes over exposure plate 230.

Although a plastic material having white color is typically used for exposure plate 230 other suitable types of material can be used for exposure plate 230. Such other types of suitable materials include, but are not limited to metal such as aluminum or other metallics having a reflective surface. An irregular reflection plate may also be used for exposure plate 230 from materials such as but not limited to metal or plastic. Preferably, the irregular reflection plate is coated with a satin finished surface such as a metal material. The metal coating can be made from, but is not limited to, aluminum formed by evaporation, plating, chemical vapor deposition or the like. The coated metal surface also should be protected with a transparent material.

Figure 8:
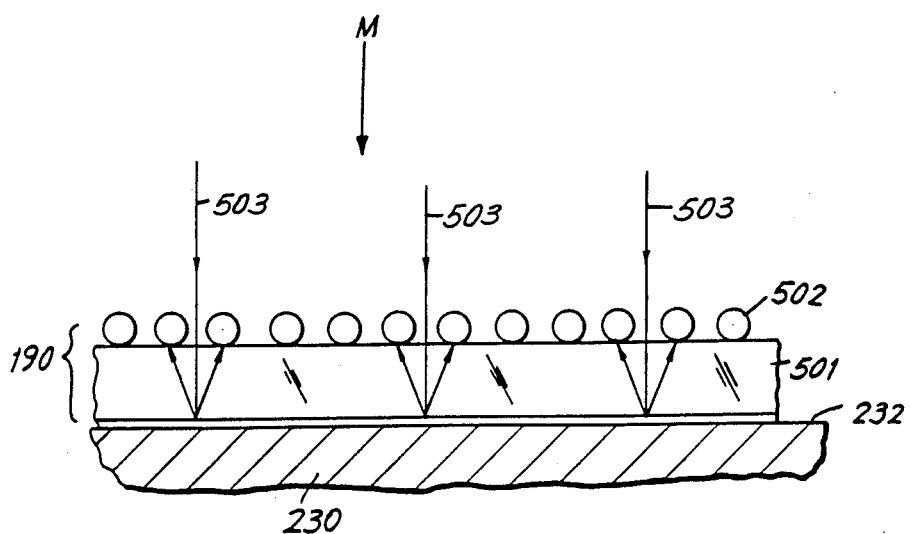
FIG. 8 is a fragmentary elevational view of an exposure plate and a photosensitive medium.

Surface 232 of exposure plate 230 is formed as a reflection plate to reflect light to utilize the light generated by halogen lamp 211 effectively for exposing photosensitive medium 190. As shown in FIG. 8, photosensitive medium 190 is transparent or semitransparent and includes a substrate 501 with a plurality of microcapsules 502 formed thereon. Photosensitive microcapsules 502 which are suitable for use on photosensitive medium 190 may be of different compositions. Various types of photosensitive microcapsules 502 and their compositions are disclosed in U.S. Pat. Nos. 4,365,018; 4,399,209; 4,440,846; 4,482,624; 4,508,807; 4,554,235; 4,576,891; 4,600,678; 4,578,339; and 4,587,194. These disclosures are incorporated herein by reference thereto.

The photosensitive imaging systems described in these U.S. Patents are commonly referred to as positive or negative imaging systems. In positive imaging systems, microcapsules 502 exposed to light or radiation increase in viscosity so that there is no release of chromogenic material. In the negative imaging system, the chromogenic material is released from microcapsules 502 which have been exposed. In the preferred image forming apparatus described herein, the positive imaging systems are preferred. U.S. Pat. No. 4,576,891 describes photosensitive microcapsules 502 which have sufficiently different sensitivities to be suitable for providing full color imaging. The colors are obtained by associating a radiation absorber with microcapsules 502 such that the sensitivity of each microcapsule 502 is reduced over portion of the spectral sensitivity range. Accordingly, microcapsules 502 provided on photosensitive medium 190 when exposed to light and upon contact with the developer on receiving medium 192 provide red, green and blue components of the original image.

A plurality of light rays 503 are directed towards microcapsules 502 in a direction denoted by arrow M. Microcapsules 502 are irradiated not only with light which initially and directly strikes photosensitive medium 190 but also with light rays that have passed through photosensitive medium 190 and have been reflected from surface 232 of exposure plate 230. Consequently, the quantity of light which strikes microcapsules 502 is increased. Exposure plate 230 permits the formation of an image on photosensitive medium 190 which is of high quality without requiring an increase in light output from halogen lamp 211 or an increase in the length of time that photosensitive medium 190 is exposed to the light rays from halogen lamp 211.

Figure 4:
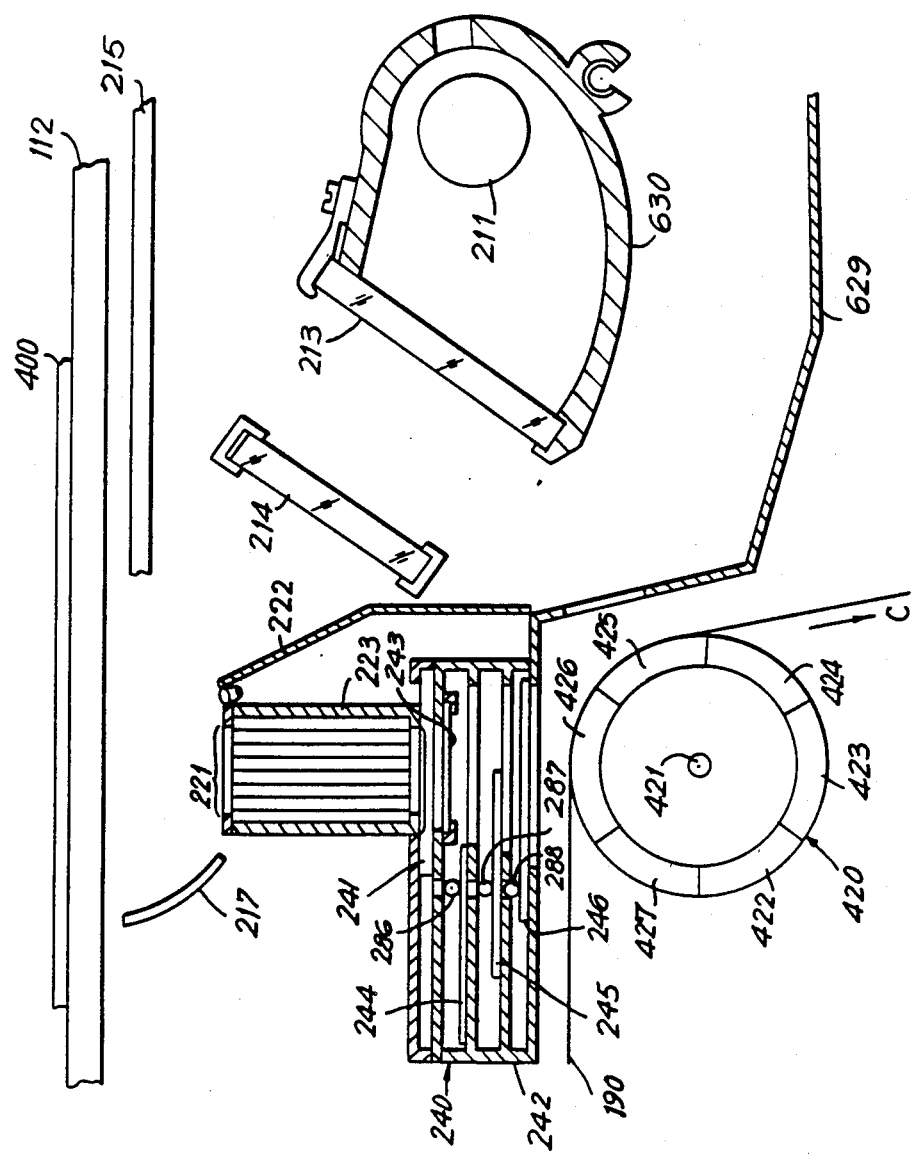
FIG. 4 is a side elevational view of an exposure mechanism, an illuminating mechanism and fragmented sections of other portions of the apparatus of FIG. 1 in accordance with another embodiment of the invention.

In an alternative embodiment, as shown in FIG. 4, an exposure drum 420 is mounted to rotate on a shaft 421 which is located at the center of exposure plate 420. Exposure drum 420 is rotated by a driving means such as a motor or the like (not shown). Exposure 420, which remains at rest or stationary during exposure of photosensitive medium 190, has a cylindrical shape and is divided into six different surface portions 422-427 having different reflectivities. Surface portion 422 has a reflectivity of approximately one hundred percent (100%), that is, a mirror-like surface. Surface portions 423, 424, 425 and 426 have reflectivities of approximately eighty percent (80%), sixty percent (60%), forty percent (40%) and twenty percent (20%), respectively. Surface portion 427 is painted black so as to reflect no light (i.e. 0%). This permits control of the level of reflectivity by rotation of exposure drum 420. Therefore, the quality of the image to be formed on photosensitive medium 190 can be modified by adjusting the level of light reflected by exposure drum 420.

As shown in FIG. 2, as photosensitive medium 190 advances from supply shaft 194 past upper pressure roller 134 to take-up shaft 198 a temperature control apparatus 799 monitors and adjusts the ambient temperature surrounding photosensitive medium 190 prior to and during exposure to light. More particularly, the ambient temperature is maintained within a substantially constant, predetermined range of temperatures which do not adversely affect the photosensitive properties of the microcapsules. Temperature control apparatus 799 includes a temperature sensor 800 disposed near or about supply shaft 194, a heating device 801 and a temperature control device 802. Temperature sensor 800 can include, but is not limited to, a thermopile.

Operation of temperature control apparatus 799 is as follows: After photosensitive medium 190 is fed from supply shaft 194, a signal representative of the ambient detected by sensor 800 is supplied to temperature control device 802. When the ambient temperature is at or below a predetermined level, temperature control device 802 provides a signal to heating device 801 so that the latter raises the level of the ambient temperature surrounding photosensitive medium 190 prior to and during exposure to light. Once the ambient temperature is within an acceptable range of ambient temperatures, photosensitive medium 190 is exposed to light from image forming lens system 220. Advantageously, temperature control apparatus 799 ensures that photosensitive medium 190 is not exposed to variations in ambient temperature which adversely influence the light sensitive properties of photosensitive medium 190.

Photosensitive medium 190 following exposure to light from image forming lens system 220 now has a latent image formed thereon. The latent image results from the hardening of certain microcapsules and other microcapsules remaining unhardened based on their reaction, if any, to the wavelengths of light from image forming lens system 220. The unhardened microcapsules are destroyed when pressed between upper pressure roller 134 and intermediate pressure roller 162. Colorant inside the destroyed microcapsules flows into the development layer of sheet (transfer medium) 192. The colorant is eventually fixed to sheet 192 to form a permanent colored image by heat treating mechanism 150.

As shown in FIG. 21, heating device 801 includes a heating plate 809 on which an exothermic resistor 803 is fixed. Alternatively, a ceramic heater or the like using an exothermic resistor can serve as heating device 801. Heating device 801 can be uniformly and quickly heated due to its construction.

As shown in FIG. 22, temperature control apparatus 799 also can include a cooling device 810 or can be used in lieu of heating device 801. Cooling device 810 includes cooling elements 805 and heat pipes 806. Cooling elements 805 and heat pipes 806 are fixed to a metal plate 804. A rear side 807 of plate 804 faces photosensitive medium 190. When the ambient temperature detected by temperature sensor 800 is at or greater than a predetermined temperature, a signal supplied to temperature control device 802 by temperature sensor 800 will result in temperature control device 801 activating cooling device 810. The ambient temperature surrounding photosensitive medium 190 will be lowered to the above-noted acceptable range of ambient temperatures prior to light from image forming lens system 220 striking photosensitive medium 190. Accordingly, the light sensitive properties of photosensitive medium 190 are not adversely affected by high ambient temperatures.

Preferably, by including both heating device 801 and cooling device 810 in temperature control apparatus 799 photosensitive medium 190 is prevented from exposure to high and low ambient temperatures which can adversely affect the quality of the latent image formed on photosensitive medium 190.

In accordance with another alternative embodiment of the invention, a heating device, as shown in FIG. 23, can include a duct 900 through which exhaust heat from heat treating mechanism 150 can be fed to raise the ambient temperature surrounding photosensitive medium 190. Furthermore, air surrounding apparatus 100 can be fed through a duct (not shown) to lower the ambient temperature surrounding photosensitive medium 190. Both the hot air from heat treating mechanism 150 and cool air surrounding apparatus 100 are fed toward photosensitive medium 190 by a fan (not shown) which is turned on and off by temperature control device 802.

The same advantageous heating and cooling of the ambient temperature surrounding photosensitive medium 190 also can be obtained by repositioning temperature control apparatus 799 within apparatus 100. For example, apparatus 799 can be located above photosensitive medium 190 so as to on the same side of the photosensitive medium 190 as image forming lens system 220, within system 220 or in other suitable areas within apparatus 100 which will permit the ambient temperature of photosensitive medium 190 to be raised or lowered, as necessary, by temperature control apparatus 799 prior to photosensitive medium 190 being exposed to light.

Referring once again to FIG. 2, compensating filter unit 240 is disposed below light shielding plate 241. A filter casing 242 made of a black resin material is disposed under image forming lens system 220 so as to mask the entire optical path of color filter unit 240 during operation of apparatus 100.

A color temperature filter 243 of compensating filter unit 240 is secured to the top interior walls of filter casing 242. Color temperature filter 243 includes one or more filters and compensates for gaps in the spectral distribution of light generated by halogen lamp 211 in accordance with the sensitivity of photosensitive member 190. Color temperature filter 243 is a dichroic filter which partially reflects rays of light having wavelengths of about 500 nanometers or greater. Filter 243 is required to compensate for the spectral distribution (i.e. color temperature) of light which is originally generated by halogen lamp 211 but which is partially lost due to heat ray reflecting filter 213 and heat ray absorbing filter 214. The degree of compensation, that is, the spectral distribution which must be compensated for is based on the sensitivity of photosensitive medium 190 to the light striking the latter in order to reproduce colors duplicating those of the original image on document 400. The term "dichroic filter" as used herein means a filter which is formed by evaporating an interference film on the surface of a transparent or semitransparent medium (e.g. transparent or colored glass). Filter 243 is capable of selectively transmitting light within a specified wavelength region.

Delicate/fine adjustment of the spectral distribution and compensation for a change in the spectral distribution of light due to the deterioration of halogen lamp 211 which cannot be satisfactorily compensated by color temperature filter 243 is provided by a yellow color adjusting filter 244, a magenta color adjusting filter 245 and/or a cyan color adjusting filter 246. Filters 244, 245 and 246 slide on driving rollers 286, 287 and 288, respectively.

Figure 5:
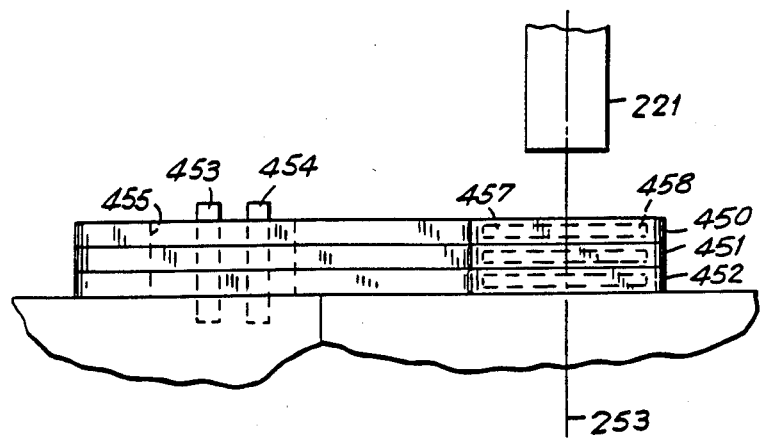
FIG. 5 is a diagrammatic elevational view of a color adjusting mechanism.

In another embodiment of a color adjusting mechanism, as shown in FIG. 5, three filter plates 450, 451 and 462 each have a slot 455 through which a pair of guide pins 453 and 454 extend. Guide pins 453 and 454 serve to guide the movement of filter plates 450, 451 and 452. A lever (not shown) moves filter plates 450, 451 and 452 independently from each other.

Figure 6:
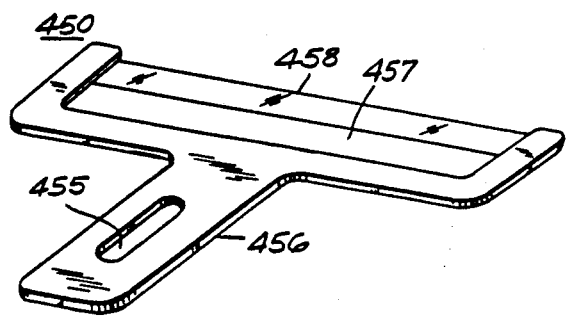
FIG. 6 is a perspective view of a filter plate of the color adjusting mechanism of FIG. 5.

FIG. 6 illustrates in greater detail filter plate 450. Filter plate 450 includes a substantially Y-shaped support member 456, a color adjusting filter 457 and a transparent glass 458. Support member 456 holds color adjusting filter 457 and transparent glass 458 together. Slot 455 through which guide pins 453 and 454 extend is located within the base of support member 456. Guide pins 453 and 454 are rigidly secured to a chassis and fixedly positioned relative to self focusing lens group 221. As shown in FIG. 5, when the lever is moved, support member 456 moves perpendicularly relative to a central axis 253 of self focusing lens group 221 and is guided in its movement by guide pins 453 and 454 within slot 455. Filter plates 451 and 452 are constructed and operate in a similar manner to filter plate 450.

Figure 7:
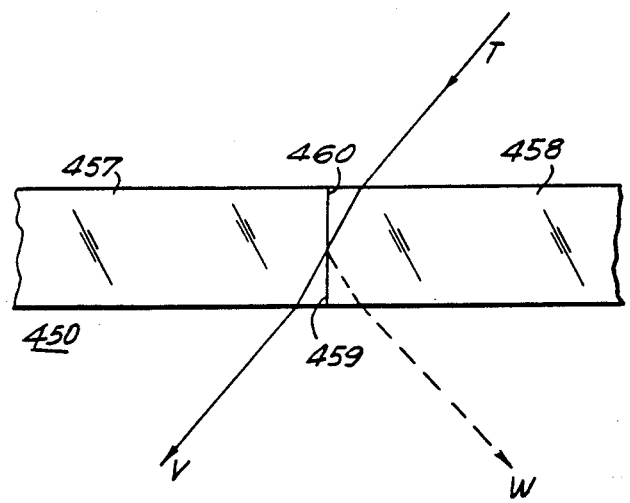
FIG. 7 is a fragmentary side elevational view of the filter plate of FIG. 6.

As shown in FIG. 7, color adjusting filter 457 and transparent glass 458 have end faces 459 and 460, respectively, which are adjacent to each other. End faces 459 and 460 extend parallel to central axis 253 of self focusing lens group 221. Since support member 456 is operable for moving perpendicularly to central axis 253, end faces 459 and 460 are always parallel to central axis 253 of self focusing lens group 221. End faces 459 and 460 which form a junction therebetween generally have simple cut surfaces. These cut surfaces normally reflect as well as transmit rays of light. Therefore, light which is incident to the junction formed by end faces 459 and 460 and which travels in a direction denoted by an arrow T will upon striking filter plate 450 travel in both directions denoted by a pair of arrows V and W. Light travelling in direction W undesirably exposes light to photosensitive medium 190 resulting in a lowering of the image resolution. By polishing end faces 459 and 460 of filter 457 and transparent glass 458, respectively, reflection of light W is prevented. Reflection caused by end faces 459 and 460 also can be prevented by the following alternative methods.

The first method prevents reflection at the junction by optical bonding, that is, end faces 459 and 460 are bonded together using an adhesive having a refractive index which is equal to that of glass. Therefore, no change in the refractive index occurs at the junction. A second method includes coating end faces 459 and 460 with black paint or the like to absorb light rays and prevent reflection. A third method involves covering half of transparent glass 458 with a film having the same transmission characteristics as those of color adjusting filter 457. A fourth method involves producing a sufficiently thin color adjusting filter 457 which will not have any effect on the optical path length of light travelling through filter plate 450. In other words, color adjusting filter is sufficiently thin so that any reflection of light which occurs at the junction formed by end faces 459 and 460 is minimal and can be disregarded.

Each individual color adjusting filter is designed so that insertion of the same within the optical path between self focusing lens group 220 and photosensitive medium 190 will not have any effect on the effective optical path length. If the effective optical path length is changed, the image formed on photosensitive medium 190 will be improperly focused. Consequently, the resolution of the image formed on photosensitive medium 190 will be distorted resulting in significant degradation of the quality of the image produced on transfer medium 192.

To avoid a change in the optical path length, the transparent glass portion of each of color adjusting filters 450, 451 and 452 is placed in front of and has the same optical path length as its corresponding color adjusting filter. For example, the thickness of transparent glass 458 is selected so that it has the same optical path length as color adjusting filter 457. Accordingly, whether the transparent glass portion or the associated color adjusting filter for each of the three filter plates 450, 451 and 452 intercepts the optical path between self focusing lens group 221 and photosensitive medium 190, the optical path length will not change occur. In other words, the image formed on photosensitive medium 190 always will be properly formed.

The thickness of the transparent glass portion can be obtained using the following equation:

$$d = (n/n - 1) \times \text{optical path length}$$

where n represents the refractive index and d is the thickness of the material through which the light travels. To provide a resolution of five (5) lines/millimeter, the optical path length can be no greater than about 0.2 millimeters. Therefore, for a maximum refractive index of 1.5, the transparent glass portion should have a thickness of about 0.6 millimeters. Alternatively, where the color adjusting filters is made sufficiently thin to have a minimal effect on the optical path length the transparent glass portion can be eliminated.

In such instances, the change in the optical path length caused by the insertion of the color adjusting filter of either filter plate 450, 451 or 452 in the optical path is within the focal depth of self focusing lens group 221 (i.e. the light can be properly focused on photosensitive medium 190).

Figure 17:
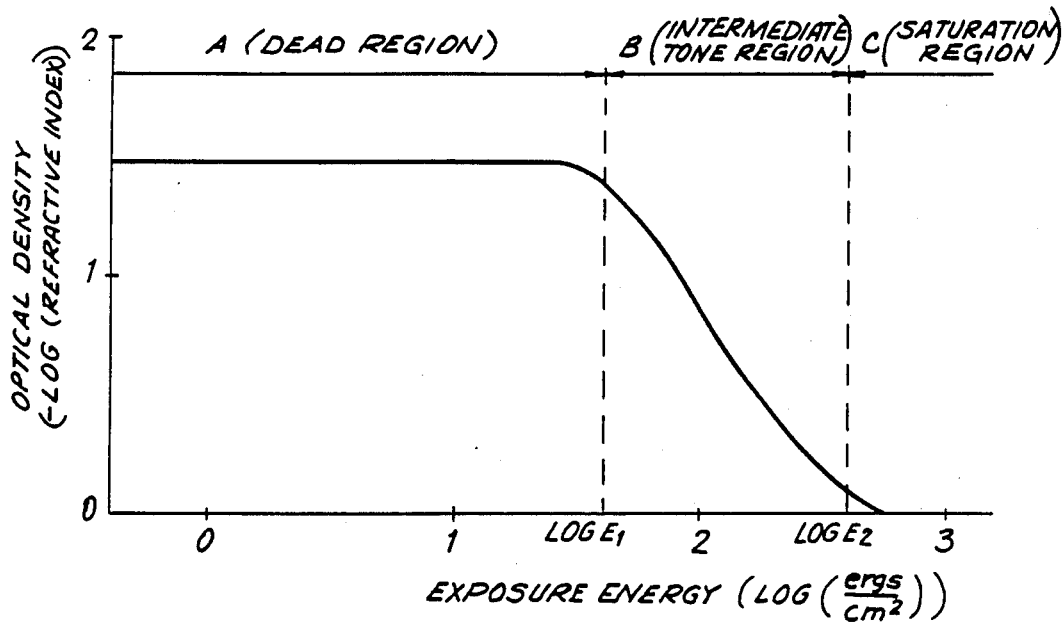
FIGS. 17-20 are plots of the optical density of the colored image formed on the photosensitive medium versus the energy of light striking the photosensitive medium.

Referring now to FIG. 17, a graph of optical (i.e. colored development) densities versus light energy levels to which photosensitive medium 190 is exposed to are shown plotted on a log-log scale. The energy levels E are in units of energy. Therefore, a value of 2 on the energy level scale is equal to 100 erg/cm2. The optical densities are in terms of −log (refractive index). Therefore a value of 1 on the optical density scale is equal to a refractive index of ten percent (10%). The range of exposure energy levels (i.e. intensities) for color development at intermediate color development densities represented by an intermediate tone region B is relatively narrow and is defined by a lower exposure energy limit E1 and by an upper exposure energy limit E. Exposure energy levels of light below energy level E1 are insufficient to reproduce an acceptable image on photosensitive medium 190 and are defined as a dead region A. Exposure energy levels of light above exposure energy E2 will also result in an unacceptable reproduction of the image on photosensitive medium 190 and are denoted as saturation region C. By adjusting the overall exposure energy level of light striking photosensitive medium 190 so that the brightest portion of the image to be reproduced is set at the boundary between intermediate tone region B and saturation C, that is at exposure energy E2, gradations of the image reproduced on photosensitive medium 190 for the brightest portions thereof are acceptable. The exposure energy level of light for the darkest portions of the image to be reproduced on photosensitive medium 190 then fall within dead region A. That is, the energy levels of light striking photosensitive medium 190 for the darkest portions of the image will be insufficient to reproduce an image on photosensitive medium 190 having sufficient gradation.

Figure 18:
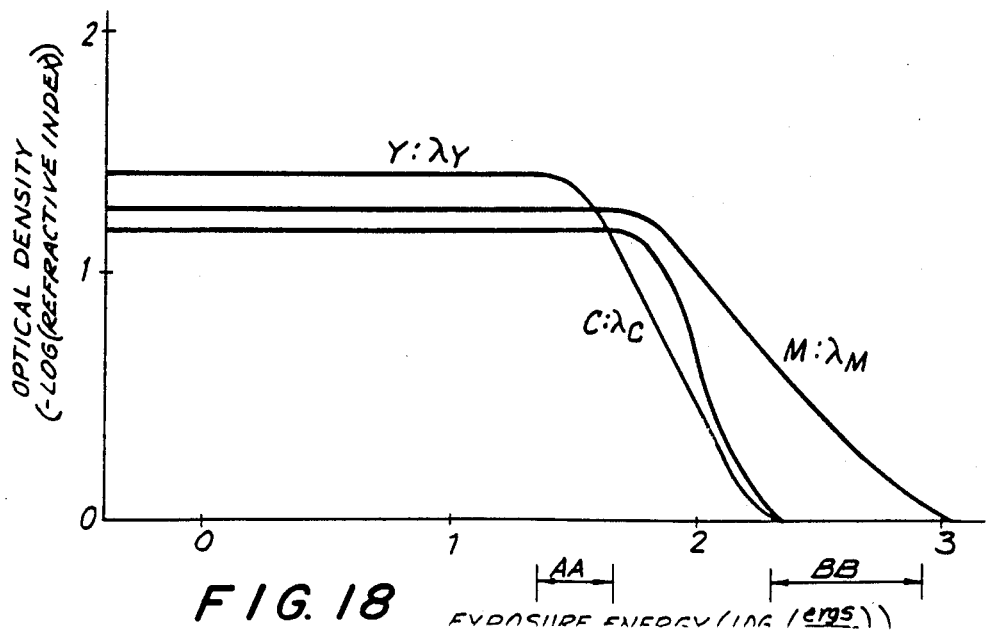

FIG. 18 is a log-log plot showing the relationship between optical densities versus exposure energies for three different kinds of microcapsules 502. Each of the three different kinds of microcapsules contain photosetting substances and either yellow (Y), magenta (M) or cyan (C) dye precursors. The wavelengths which affect the photosetting substances for the microcapsules containing yellow, magenta and cyan precursors are represented by $\lambda Y$, $\lambda M$, and $\lambda C$, respectively. The characteristic curves plotted in FIG. 18 are based on applying light having wavelengths of $\lambda Y$, $\lambda M$, and $\lambda C$ to microcapsules 502 with a uniform energy distribution to provide a gray image with acceptable gradation. Portion AA along the exposure energy axis represents a relatively small amount of exposure energy striking photosensitive medium 190 and results in insufficient development of microcapsules 502 having yellow dye precursor. The resulting image formed is bluish. Portion BB along the exposure energy axis represents a relatively large amount of exposure energy striking photosensitive medium 190. Only those microcapsules having magenta precursor are developed within exposure energy region BB.

The problems illustrated in FIGS. 17 and 18 are also experienced with silver halide photography and the like. However, in the image forming process where a photosetting reaction and a color developing reaction caused by destruction of microcapsules is used, these problems are particularly noticeable. In particular, a considerable degradation in the quality of the formed image on photosetting medium 190 results and is due to the dependency of the photosetting reaction on the wavelengths of light striking photosensitive medium 190. Consequently, intermediate tones of the image to be reproduced cannot be effectively controlled during the partial or complete destruction of microcapsules 502 during the pressure development process.

Figure 19:
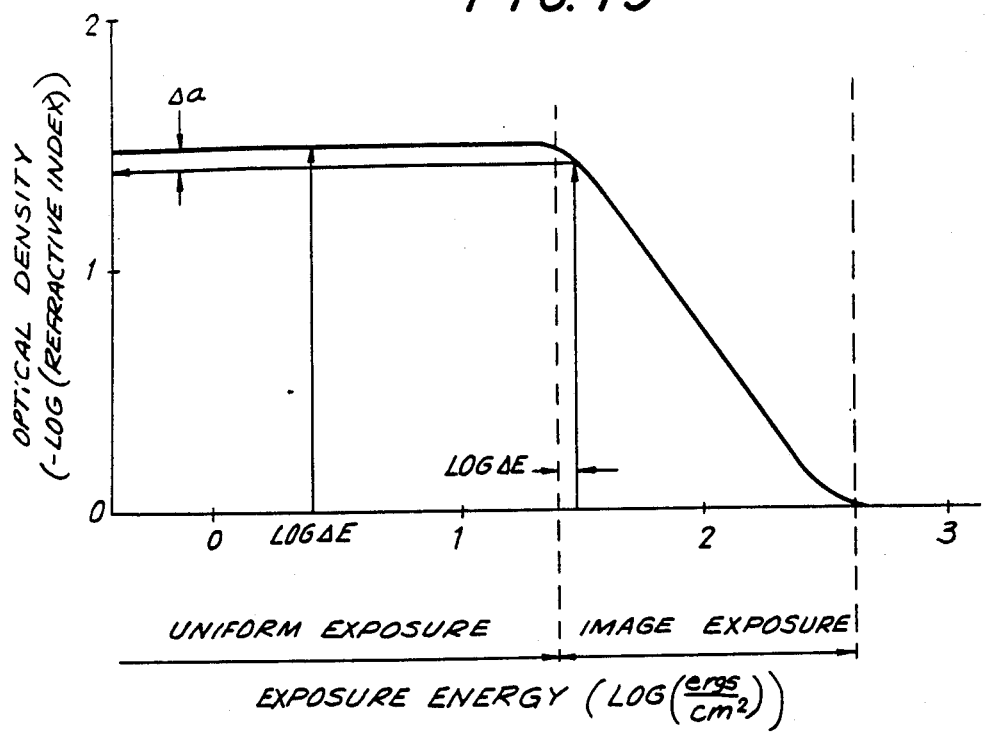
Figure 20:
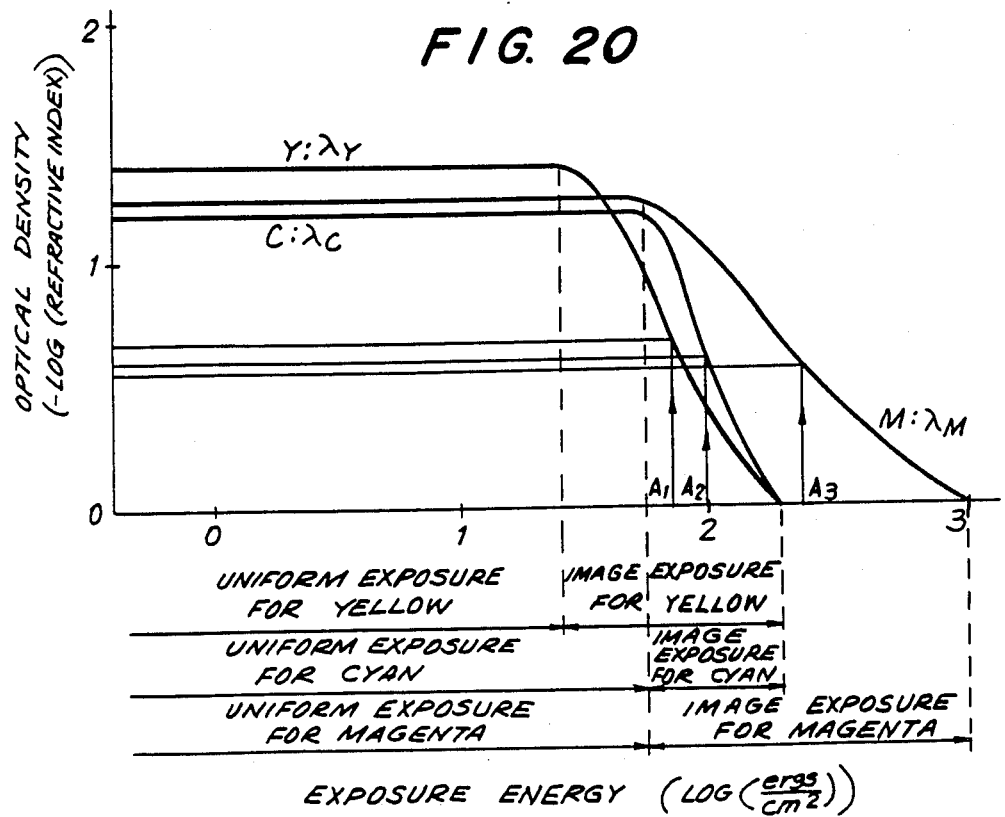

These problems described in connection with FIGS. 17 and 18 are overcome in accordance with the invention as illustrated in FIGS. 19 and 20. FIGS. 19 and 20 are substantially similar to FIGS. 17 and 18, respectively. However, photosensitive medium 190 is subjected to exposure of a uniform light energy level (hereinafter referred to as uniform exposure energy) equal to the minimum effective level of exposure energy E1. Thereafter, photosensitive medium 190 is subjected to light energy so that the brightest portion of the image to be reproduced receives an additional quantity of exposure energy equal to $E2 - E1$ ($\Delta E$) which is hereinafter referred to as the image exposure energy. In this way, even if the image exposure amount $\Delta E$ is relatively small, a change in the color development density ($\Delta a$ of the image can be reproduced with excellent intermediate tones.

As shown in FIG. 20, the uniform light energy which photosensitive medium 190 is exposed to can be varied based on the type of microcapsule to be struck by the light. The uniform exposure energy is set for the minimum effective level of energy for each of the three different kinds of microcapsules 502, that is for microcapsules containing yellow, magenta and cyan dye precursors. The image exposure energy, that is the exposure energy necessary to reproduce the image beyond the uniform exposure energy level for each color is set so that the sum of the uniform exposure energy level (E1) and image exposure energy level ($\Delta E$) for the brightest portion of the image to be reproduced is equal to the maximum effective exposure energy level (E2) (i.e. $E2 = E1 + \Delta E$). Arrows A1, A2 and A3 represent the sum of the uniform exposure energy level and half of the maximum image exposure energy ($\Delta E$) for microcapsules 502 having yellow, cyan and magenta dye precursors, respectively. The colors of the image formed are substantially and uniformly developed and result in a gray image having excellent reproduced tones.

Once the uniform exposure energy level has been applied to the microcapsules, its effectiveness is relatively short lived. This is due, in part, to the light energy being gradually released from those portions of photosensitive medium 190 where hardening (i.e. setting) or softening of microcapsules 502 has not yet begun. In other words, the minimum and necessary energy level of light (E1) begins to dissipate from the time that the light energy strikes photosensitive medium 190.

In particular, where the image exposure energy level is applied to photosensitive medium 190 well after the completion of the uniform exposure energy process, excellent intermediate tone and overall color reproducibilities obtainable in accordance with the invention is lost. Accordingly, it is essential that the period of time following completion of the uniform exposure energy process to the beginning of the pressure development process be minimized.

Referring once again to FIG. 2, uniform intensity device 260, which provides for a uniform exposure of light energy striking photosensitive medium 190, includes a slit 261 in reflector 212, a color compensating filter 263, and a diaphragm 265. Diaphragm 265 is slidable through a feed roller 264 on a casing member 216. Feed roller 264 has a shaft (not shown), which extends through a side plate of the outer casing of apparatus 100 so as to project outside the exterior surface of apparatus 100. By rotating this shaft, diaphragm 265 can be moved in the directions denoted by arrow J to adjust the level of light which photosensitive medium 190 is exposed to.

Direct light generated from halogen lamp 211 travels through slit 261 and serves as a light source for the uniform exposure of light striking photosensitive medium 190. Color compensating filter 263 is a single absorption type glass filter having well balanced characteristics so that the correct exposure levels for yellow, magenta, and cyan microcapsules 502 are obtained. Diaphragm 265 controls the amount of uniform exposure energy which strikes all three kinds of microcapsules 502 on photosensitive medium 190.

Due to variations which may occur among individual parts of apparatus 100 and changes in the environmental conditions such as temperature and humidity under which apparatus 100 operates, filter 263 and diaphragm 265 may not be sufficient to produce the uniform exposure energy levels required for excellent reproduction of intermediate tones of the image. To compensate for these variations among individual parts and ambient conditions, three slits 262 in casing number 216 are provided. The first, second and third slits 262 include red, green and blue filters, respectively. Therefore, light having a uniform intensity which strikes photosensitive medium 190 includes red, green and blue components. Each of these slits also includes a diaphragm for covering a portion or all of the filter within the associated slit. Accordingly, color tone and reproducibility can be more delicately and precisely controlled to compensate for the aforementioned variations.

Figure 9:
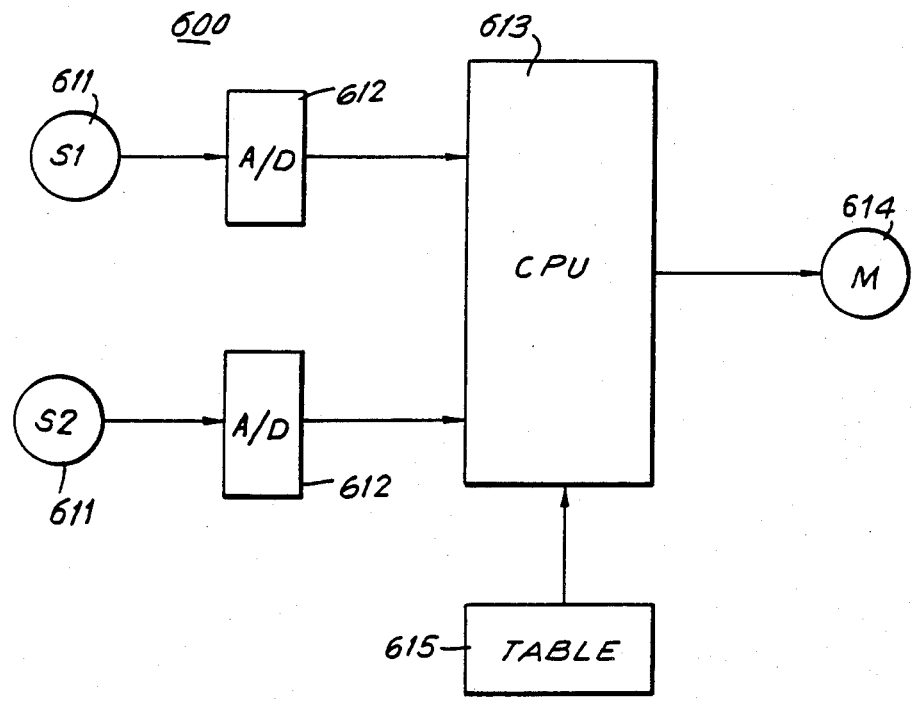
FIG. 9 is a block diagram of a control system for maintaining a uniform level of exposure energy directed toward the photosensitive medium.

An automatic control system 600, shown in the circuit of FIG. 9 is used to cope with variations in the uniform exposure energy level due to temperature and humidity. Control system 600 includes a temperature sensor 610 and a humidity sensor 611 which are disposed within apparatus 100 and which detect analog signals representative of the temperature and humidity surrounding temperature sensor 610 and humidity 611. These analog signals are then converted into digital signals by processing circuits 612. The digital signals representing temperature and humidity are then inputted to a central processing unit (CPU) 613. Based on the digital input signals, CPU 613 will refer to a preset constant table 615 whose data will be used to send an appropriate driving signal to a motor 614. Motor 614 is used for opening and closing diaphragms 262 and/or 265 for controlling the level of uniform light energy which photosensitive medium 190 is exposed to.

Figure 10:
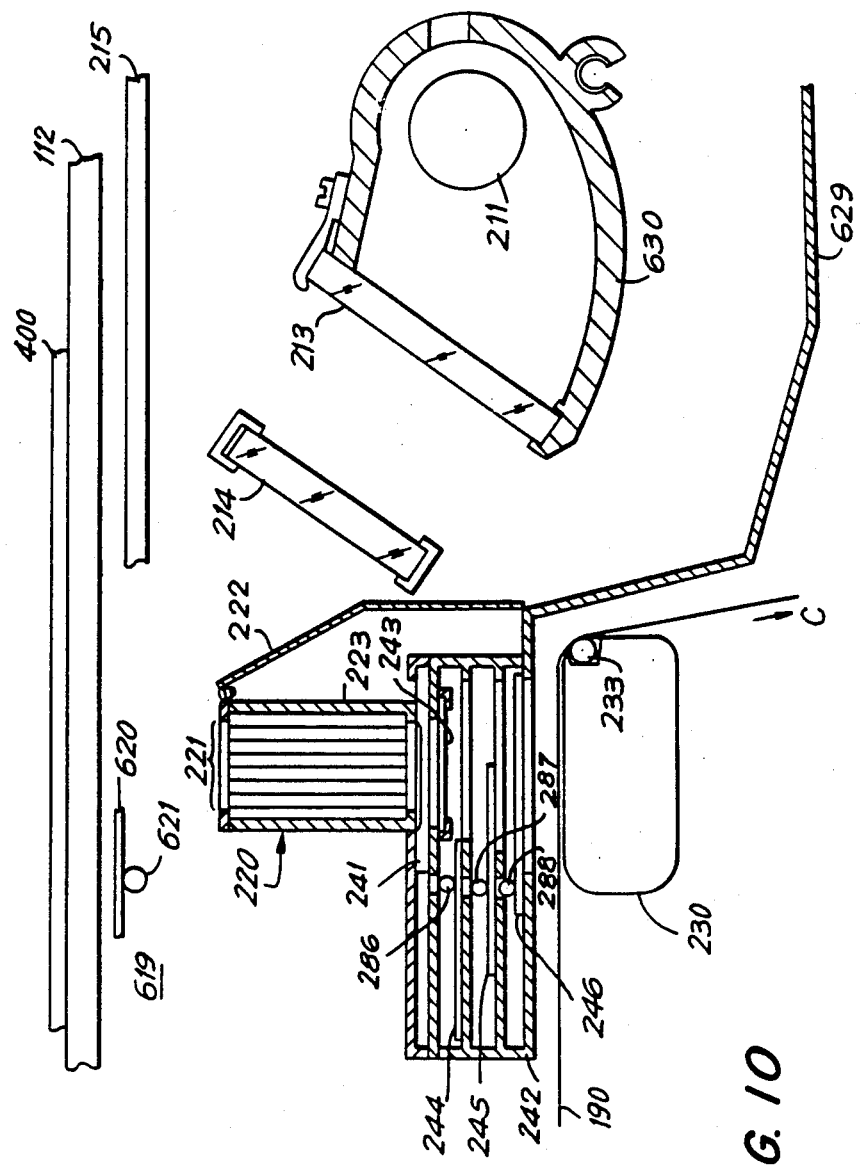
FIG. 10 is a front elevational view of an exposing mechanism, an illuminating mechanism and fragmented sections of other portions of the apparatus of FIG. 1 in accordance with another alternative embodiment of the invention.

FIG. 10 illustrates an alternative uniform exposure mechanism in accordance with the invention. Those portions of FIG. 10 as well as portions of other FIGS. having the same elements described herein are identified by like reference numerals. Illuminating mechanism 210 includes a reflector 630 which is substantially similar to reflector 212 of FIG. 2 except that slit 261 is not provided in reflector 630. Furthermore, in lieu of uniform exposure optical system 260 as in FIG. 2, a uniform exposure mechanism 619 including casing member 629, which is not formed with slits 262 in member 216, is used. Casing member 629 is otherwise similar in construction to casing member 216. Reflector 630 and casing member 629 are also provided in the alternative embodiment of the invention shown in FIG. 4.

Uniform exposure mechanism 619 includes a reflecting plate 620 having a substantially white surface area facing self focusing lens group 220 and a feed roller 621. Light which is generated from halogen lamp 211 irradiates not only document 400 but also the white surface area of reflecting plate 620. Therefore, self focusing lens group 220 will project not only the image of document 400 but also the image from reflecting plate 620. As shown in FIG. 10 reflecting plate 620 is not disposed at the focal point of self focusing lens group 220 (i.e. the image from reflecting plate 620 is out of focus for reproduction on photosensitive medium 190). In order to provide a focused uniform exposure of light energy on photosensitive medium 190, feed roller 621 includes a shaft (not shown) constructed similar to the shaft of feed roller 264 which can be rotated so that reflecting plate 620 is positioned at the focal point of self focusing lens group 220. Accordingly, by rotation of the shaft associated with feed roller 621 reflecting plate 620 can be advanced or withdrawn with respect to self focusing lens group 220 so that a uniform exposure of light energy is provided to photosensitive medium 190 when desired.

In FIGS. 2 and 10, a single light source, namely halogen lamp 211 has been employed to provide a uniform exposure of light energy to photosensitive medium 190. In yet another alternative embodiment of the invention, light energy uniformly exposed to photosensitive medium 190 can be obtained by using a separate light source rather than halogen lamp 211.

Figure 11:
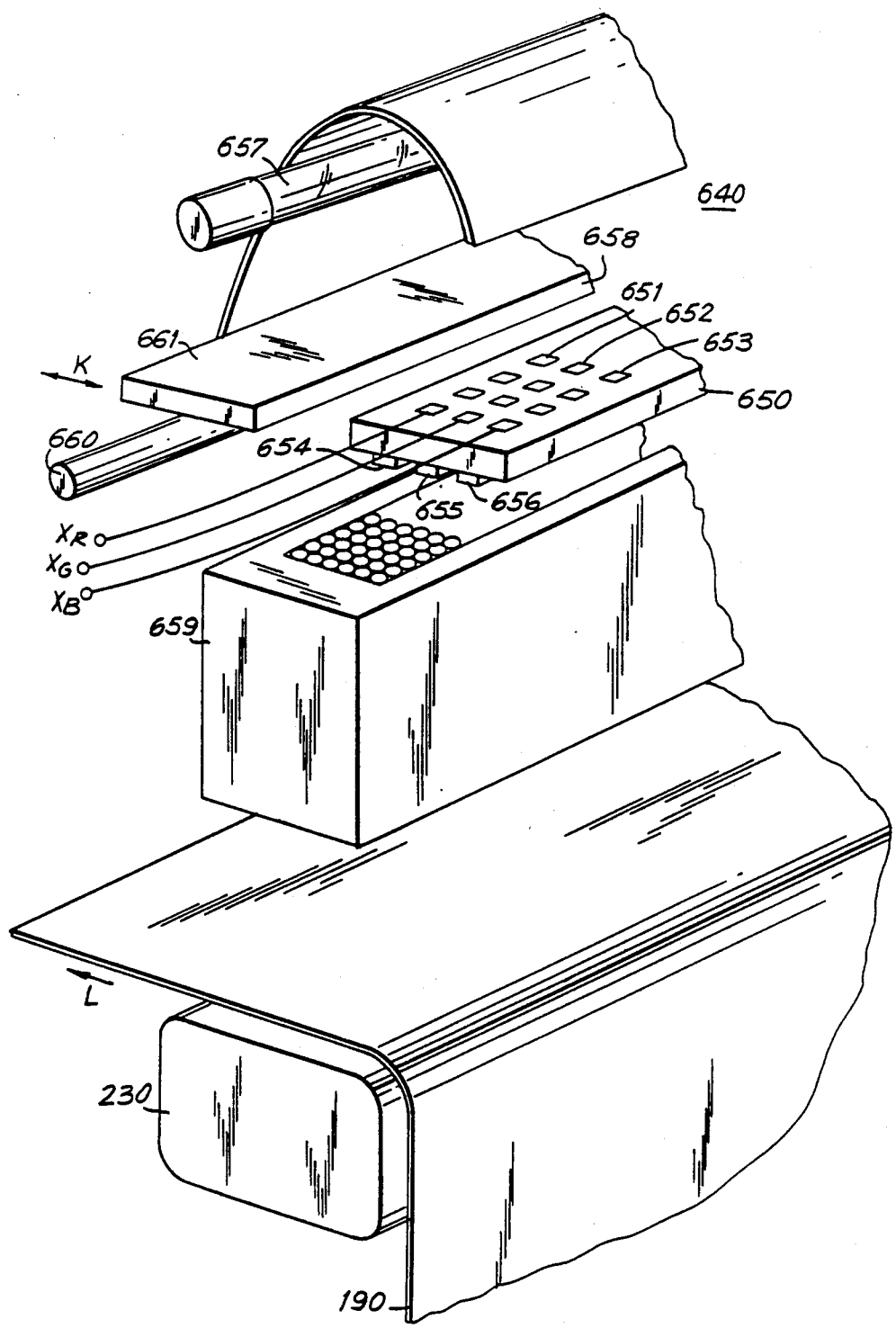
FIG. 11 is a fragmented perspective view of an exposure mechanism and other portions of an image forming apparatus in accordance with another alternative embodiment of the invention.

As shown in FIG. 11, an image forming apparatus 640 records an image on photosensitive medium 190 by controlling the light transmitted to photosensitive medium 190 through an array of liquid crystal light shutters 650 which are opened and closed in accordance with electrical signals representative of the image to be reproduced. These electrical signals XR, XG and XB represent the red, green and blue colors of the image, respectively, and are applied in the form of voltages to rows of microshutter 651, 652 and 653 in an array.

Microshutter rows 651, 652 and 653 are arranged in liquid crystal light valve 650 so that the transmittances of each microshutter row changes in accordance with the voltage applied thereto. Red filters 654, green filters 655 and blue filters 656 are disposed below microshutter rows 651, 652 and 653, respectively. Light generated by a halogen lamp 657 is directed in part to liquid crystal light valve 650 and in part through an opening 658 (i.e. a slit). Light passing through opening 658 provides uniform exposure of light energy to photosensitive medium 190.

A self focusing lens group 659 similar to self focusing lens group 220 projects the images produced by microshutter rows 651, 652 and 653 onto photosensitive medium 190. Signals XR, XG and XB supplied to microshutter rows 651, 652 and 653 are applied at a rate which corresponds to the speed at which photosensitive medium 190 advances over exposure plate 230. The amount of uniform light energy which is directed toward photosensitive medium 190 is controlled through a diaphragm 661 which is moveable in directions denoted by an arrow K. A feed roller 660 controls movement of diaphragm 661 in the same manner as feed roller 264 controls movement of diaphragm 265 of FIG. 2.

The image to be reproduced on photosensitive medium 190 is obtained by first scanning photosensitive medium 190 with light passing through a slit (not shown) of self focusing lens group 659 which represents the image exposure energy. Within several seconds after completion of the image exposure energy process, photosensitive medium 190 is transported in a direction of an arrow L to receive a uniform exposure of light passing through opening 658. The time interval from the scanning of photosensitive medium 190 (i.e. the image exposure process) to the uniform exposure of light on photosensitive medium 190 through opening 658 is fixed for each position of the image to be formed on photosensitive medium 190. Accordingly, the time constraints required to provide an effective uniform exposure energy level striking photosensitive medium 190 are met for all portions of the image to be formed on photosensitive medium 190.

In order to avoid unnecessary color development from occurring outside the image forming region of photosensitive medium 190 and prevent the contour of the image forming region from becoming blurred, apparatus 100 also exposes and thereby sets the photosetting substances on photosensitive medium 190 which are outside the image forming region. Accordingly, the nonimage forming regions of photosensitive medium 190 will "appear white" when transferred to transfer medium 192. Exposure of the nonimage forming regions of photosensitive medium 190 is effected through the use of reflected light which is generated by halogen light 211.

Image forming in accordance with the invention assumes that a plurality of duplicate copies of a single original document will be made at one time on a continual basis. When the copying operation of apparatus 100 is initiated, plate 112 moves in a direction of arrow F from its standby position as shown in FIG. 2 by an amount corresponding to the size of the uppermost sheet of transfer medium 192. The leading edge of document 400 reaches a predetermined position where it is illuminated by halogen lamp 211. Plate 112 then moves in a direction of arrow E so that the entire document 400 is illuminated from its leading edge to its trailing edge by halogen lamp 211. Photosensitive medium 190 is exposed to the reflected light from document 400. The image forming region and nonimage forming regions of photosensitive member 190 are contiguous with each other.

After the trailing edge portion of document 400 has been illuminated, white plate 291 is subsequently illuminated. White plate 291 which exposes regions other than the image forming region on photosensitive medium 190 is defined by a plate painted white made of a metal such as, but not limited to iron, aluminum or a resin material. White plate 291 has a length l1 which is at least twice the distance from the trailing edge of the image to the edge of a sheet of transfer medium 192 on which the image is to be transferred to. The visible light reflected from white plate 291 becomes white light which passes through self focusing lens group 220 and strikes photosensitive medium 190 to expose the nonimage forming region. Since white light includes all colors, namely yellow, magenta and cyan, the white light applied to photosensitive medium 190 causes all microcapsules 502 in that region to set. Subsequently, substantially all microcapsules 502 in the nonimage forming region of photosensitive medium 190 are set (i.e. hardened) by exposure to the white light.

Exposed photosensitive medium 190 is fed into pressure developing mechanism 130 in the following order. First, a non-image forming region which has been exposed to white light from white plate 291 is received by pressure developing mechanism 130. Then, an image forming region representing reflected light from document 400 is fed into pressure developing mechanism 130. Finally, another nonimage forming region which has been exposed to white light from white plate 291 is received by pressure developing mechanism 130. During pressure development, the leading edge portion of transfer medium 192 is first colored white, that is, the area between the leading edge of transfer medium 192 and image forming region is colored white. Subsequently, the image from photosensitive medium 190 is transferred to transfer medium 192. The trailing edge portion of transfer medium 192 is then colored white, that is, the remaining portion of transfer medium 192 is colored white. Accordingly, white edges are clearly formed at the leading and trailing edge portions of transfer medium 192 despite being pressed against photosensitive medium 190 by intermediate pressure roller 162 during the pressure development process.

Although scanning by halogen lamp 211 of white plate occurs after scanning of document 400, formation of a white image prior to formation of an image of document 400 on photosensitive medium 190 is provided due to length l1 of white plate 291. More particularly, length l1 of white plate 291 is twice the length of the margin required to color white one edge portion of transfer medium 192. Therefore, the white image formed on photosensitive medium 190 by one scan of white plate 291 can be used for both the trailing edge portion of the uppermost sheet of transfer medium 192 and the leading edge portion of the subsequent uppermost sheet of transfer medium 192. Liquid component contained in microcapsules 502 does not flow to adhere to transfer medium 192. Separation of transfer medium 192 from photosensitive medium 190 is easily and readily accomplished following pressure development.

When a first document 400 is replaced with a second document of different dimensions, transport of photosensitive medium 190 must be temporarily suspended in order to edge transfer medium 192 properly. Prior to such suspension, white plate 291 has been scanned by the light from halogen lamp 211 and has formed an image on photosensitive medium 190. Photosensitive medium 190 is then rewound in a direction opposite to arrow D of FIG. 2. The second document 400 is then exposed to the light from halogen 211. Accordingly, image forming in accordance with the invention ensures that photosensitive medium 192 will be exposed to light representative of the new document 400 in a region which is contiguous to the region already exposed to white light from white plate 291.

Image forming in accordance with the invention using white plate 291 prevents unnecessary color development from occurring outside the image forming region of photosensitive medium 190 and prevents the image forming region of photosensitive medium 190 from becoming blurred during pressure development. As described heretofore, white plate 291 is provided on the left end side of original document 400 as shown in FIG. 2, but image forming in accordance with the invention is not necessarily limited to this construction. For example, white plate 291 may be provided on the right end side of original document 400. In another alternative embodiment, two white plates 291 at both the left end side and right end side of original document 400 can be used.

Figure 12:
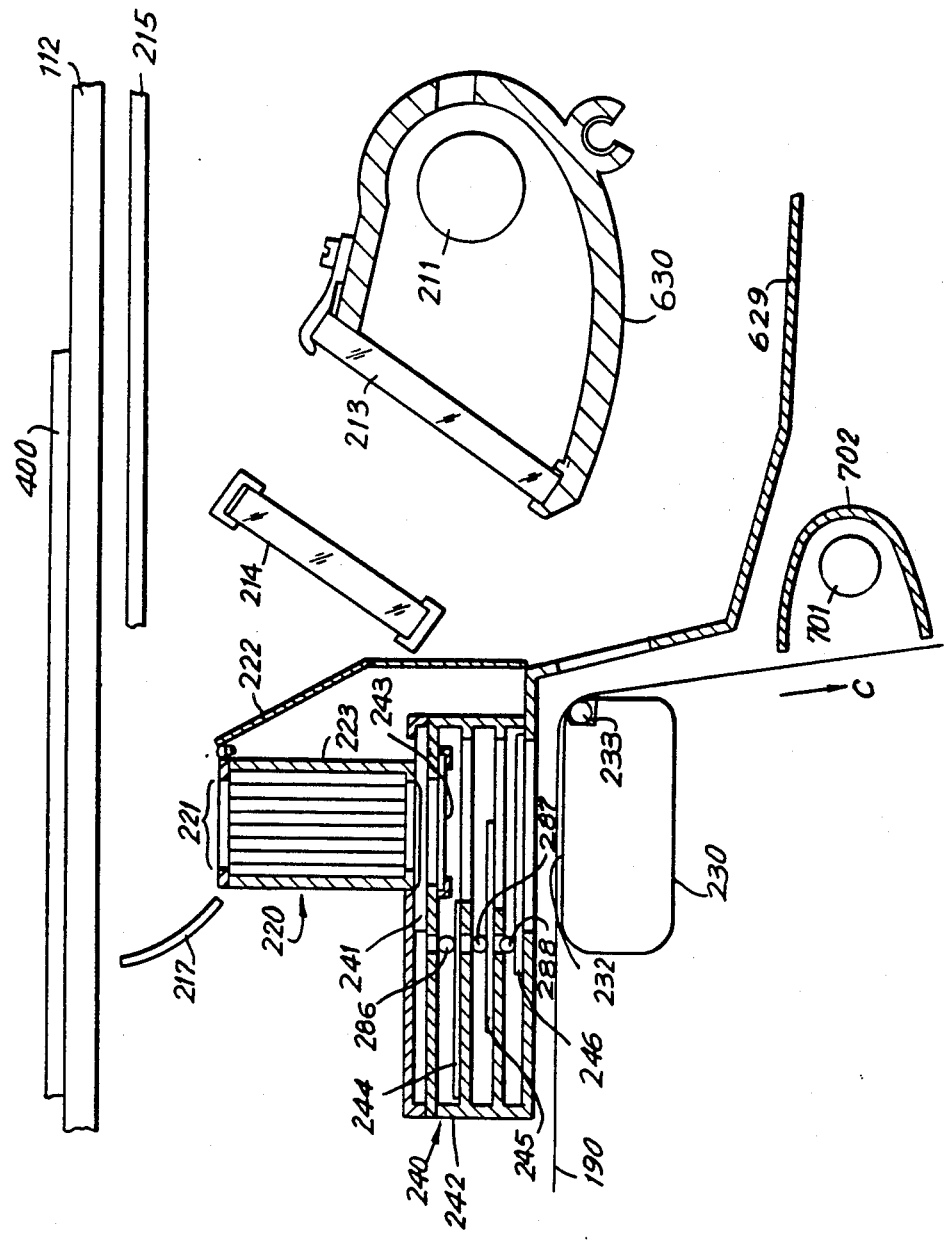
FIG. 12 is a front elevational view of an exposing mechanism, illuminating mechanism and fragmented sections of other portions of the apparatus of FIG. 1 in accordance with yet another alternative embodiment of the invention.

Halogen lamp 211 has been described as providing the light energy required for exposure of both the image forming regions and the nonimage forming regions of photosensitive medium 190. A separate light source can be used for exposing nonimage forming regions of photosensitive medium 190 in lieu of halogen lamp 211. For example, as shown in FIG. 12 an auxiliary light source 701 may be positioned below casing member 629 which serves to set substantially all microcapsules in a predetermined, nonimage forming region of photosensitive medium 190. A reflector 702 reflects light from auxiliary light source 701 towards photosensitive medium 190 to utilize the light in an efficient manner. In one preferred embodiment, a white fluorescent lamp having a rating of approximately fifteen (15) watts in the shape of a straight tube is employed as auxiliary light source 701. Auxiliary light source 701 and a reflector 702 are arranged so that regions of photosensitive medium 190 outside the image forming region are illuminated by the light generated from auxiliary light source 701. Accordingly, the leading and trailing edges of transfer medium 192 which will correspond to these nonforming image regions on photosensitive medium 190 will appear white in color.

Figure 13:
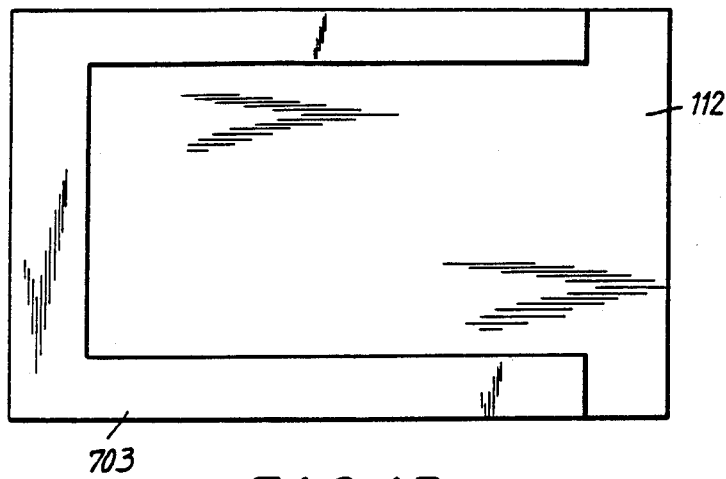
FIG. 13 is a top plan view of a pair of plates of the apparatus of FIG. 1.
Figure 14:
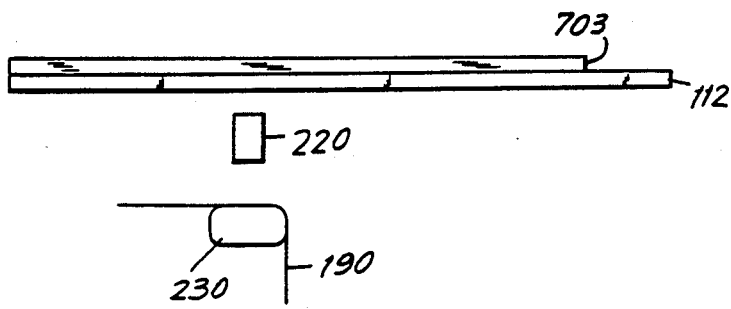
FIG. 14 is a side elevational view of the pair of plates of FIG. 13 and of other portions of the apparatus of FIG. 1.

In order to improve the quality (i.e. appearance) of the image transferred to transfer medium 192 and to enhance the reliability of pressure developing mechanism 130, all regions of transfer medium 192 which surround the image forming region should be exposed. Exposure of all nonimage forming regions on photosensitive medium 192 is accomplished through a U-shaped white plate 703 shown in FIGS. 13 and 14. The U-shaped configuration of white plate 703 ensures that the nonimage forming lateral edge portions of photosensitive medium 190 and the nonimage forming trailing and leading edge portions of photosensitive medium 190 are exposed so as to set/harden microcapsules 502. Operation of apparatus 100 using white plate 703 is otherwise similar to the operation of apparatus 100 using white plate 291.

Figure 15:
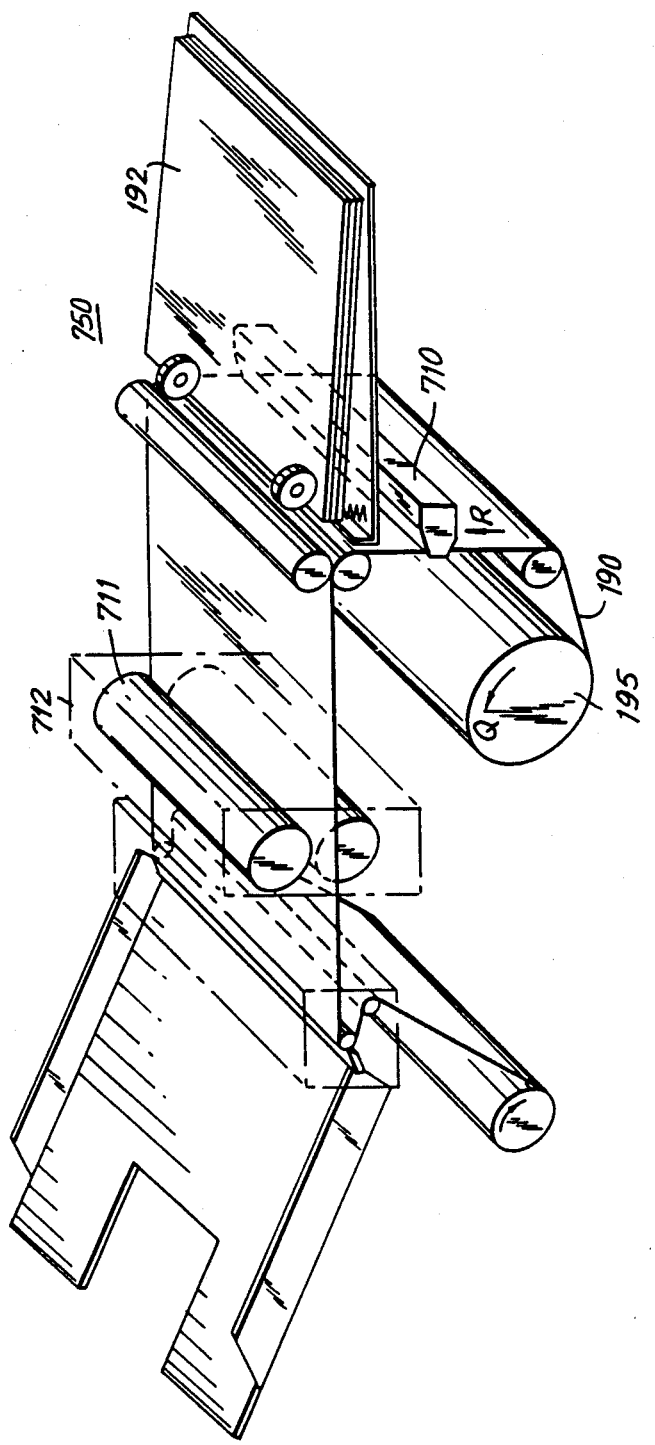
FIG. 15 is a diagrammatic perspective view of an image forming apparatus in accordance with still another alternative embodiment of the invention.

FIG. 15 illustrates an image forming printer 750 which employs a liquid crystal shutter array in accordance with the invention. Photosensitive medium 190 is unwound from a supply roll 195 in a direction denoted by an arrow Q and travels in a direction denoted by an arrow R so as to pass underneath an optical write head 710. Optical write head 710 includes a light source and a liquid crystal microshutter array (both of which are not shown). The liquid crystal microshutter array is operable for selectively shielding and transmitting light from the light source in accordance with the image data supplied thereto.

Figure 16:
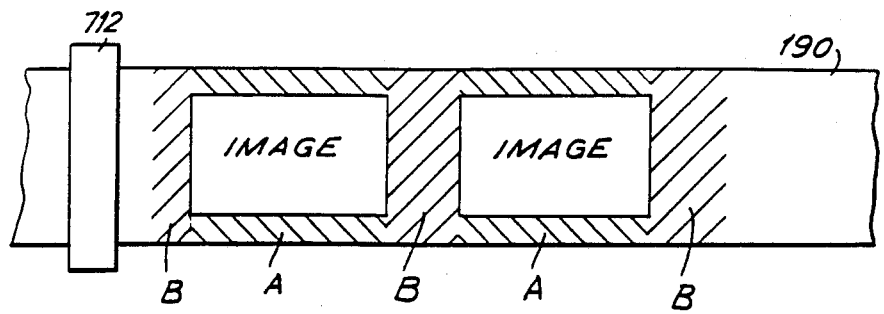
FIG. 16 is a fragmentary top plan view of the photosensitive medium of FIG. 15.

As the microcapsules which contain the photosetting substances and color developing agents on a substrate of photosensitive medium 190 travel past optical write head 710, a region wider than the width of photosensitive medium 190 is exposed to light. Print signals are supplied to write head 710 which cause the liquid crystal microshutters to transmit light in those areas corresponding to hatched regions A and B of photosensitive medium 190 as shown in FIG. 16. Hatched regions A represent the lateral edges (i.e. both sides) of photosensitive medium 190 which are outside the image forming region thereof. Hatched regions A extend in a direction which is substantially perpendicular to the direction in which photosensitive medium 190 advances. Hatched regions B represent the leading and trailing edges of photosensitive medium 190 which are outside the image forming regions thereof.

By exposing hatched regions A and B to white light so as to set the microcapsules outside the image forming region of photosensitive region 190, all portions of photosensitive medium 190 which are outside of the image forming region are set and thereby ensure that no undesired color development occurs. The boundaries of the image forming region will also not be blurred. In creating hatched regions B of photosensitive medium 190, the entire surface of the liquid crystal microshutter array is made transparent and remains transparent between image forming regions. The image to be formed is formed in the image regions by selectively opening and closing the microshutters in the image region of the array in optical write head 710.

Following exposure of light from the liquid crystal microshutter array which is representative of the image forming and nonimage forming regions, transfer medium 192 is laid on photosensitive medium 190. Transfer medium 192 and photosensitive medium 190 are then pressed together by a pressure roller 711 of a pressing device 712. The image forming region and nonimage forming regions of photosensitive medium are transferred to transfer medium 192. During transfer of the image from photosensitive medium 190 to transfer medium 192, a greater number of microcapsules 502 are crushed in regions which have received less exposure to light energy. Microcapsules 502 in the nonforming image regions, which correspond to hatched regions A and hatched regions B, are not crushed because the same have been sufficiently hardened by exposure to white light. Accordingly, no unnecessary color development or blurred boundaries around the image forming region are produced on transfer medium 192. Furthermore, since microcapsules 502 in the nonimage forming regions have been sufficiently hardened so as not to be crushed by pressing device 712, adherence of photosensitive medium 190 to the surface of pressure roller 711 is prevented. Therefore, deterioration of the pressure roller 711 also avoided.

Apparatus 750 as described heretofore has employed a light source and a liquid crystal microshutter array as part of optical write head 710. Alternative embodiments of optical write head 710 can employ a light emitting diode (LED) array, a laser scan system or the like in lieu of a separate light source and liquid crystal microshutter array.

As now can be readily appreciated, the invention provides an image forming apparatus which reproduces an image having excellent gradation throughout the entire range of optical densities, reproduces hues of the image with high fidelity, prevents unnecessary color development outside the image forming region, facilitates the separation of photosensitive medium 190 from transfer medium 192 following the pressure development process, prevents the boundaries of the image forming region from becoming blurred and prevents the light sensitive microcapsules from being adversely affected by high and low ambient temperatures prior to exposure to light.

It will thus be seen that the objects set forth above, and those made apparent from the preceding description, are efficiently obtained and since certain changes may be made in the above method and constructions set forth without departing from the spirit and scope of the invention, it is intended that all matter contained in the above description and shown in the accompanying drawings shall be interpreted as illustrative and not in a limiting sense.

It is also to be understood that the following claims are intended to cover all the generic and specific features of the invention herein described, and all statements of the scope of the invention which, as a matter of language, might be said to fall therebetween.

What is claimed is:

1. An image forming apparatus for forming an image on a transfer medium by pressing the transfer medium against a photosensitive medium having light sensitive microcapsules thereon, the apparatus comprising:
   an illuminating mechanism for illuminating said photosensitive medium;
   exposure means for subjecting a first predetermined region of the photosensitive medium to light representative of the image and a second predetermined region of the photosensitive medium to light nonrepresentative of the image prior to pressing the transfer medium against the photosensitive medium; and
   temperature control means for maintaining the ambient temperature surrounding at least the first predetermined region and the second predetermined region of the photosensitive medium within a predetermined range to prevent the ambient temperature from adversely affecting the light sensitive microcapsules in the first and second predetermined regions.

2. The image forming apparatus of claim 1, wherein the temperature control means includes heating means for raising said ambient temperature.

3. The image forming apparatus of claim 2, further including fixing means for permanently fixing the image on the transfer medium and which produces exhaust heat and wherein the heating means includes means for transferring the exhaust heat of the fixing means to an area surrounding said first and second predetermined regions to maintain said ambient temperature within said predetermined range.

4. The image forming apparatus of claim 1, wherein the temperature control means includes cooling means for lowering said ambient temperature.

5. The image forming apparatus of claim 2, wherein the temperature control means further includes cooling means.

6. The image forming apparatus of claim 2, wherein the temperature control means includes sensing means for detecting said ambient temperature and a control device for controlling the heating means based on the ambient temperature detected by said sensing means.

7. The image forming apparatus of claim 4, wherein the temperature control means includes sensing means for detecting said ambient temperature and a control device for controlling the cooling means based on the ambient temperature detected by said sensing means.

8. The image forming apparatus of claim 5, wherein the temperature control means includes sensing means for detecting said ambient temperature and a control device for controlling the heating means and cooling means based on the ambient temperature detected by said sensing means.

9. The image forming apparatus of claim 1, wherein the illuminating mechanism includes means for directly illuminating the photosensitive medium.

10. The image forming apparatus of claim 1, wherein the illuminating mechanism includes means for indirectly illuminating the photosensitive medium.

11. The image forming apparatus of claim 9, wherein the illuminating mechanism further includes means for indirectly illuminating the photosensitive medium.

12. The image forming apparatus of claim 1, wherein the first and second predetermined regions are positioned between the exposure means and the temperature control means.

13. The image forming apparatus of claim 1, wherein the temperature control means is positioned within the exposure means.

14. An image forming apparatus for forming an image on a transfer medium by pressing the transfer medium against a photosensitive medium having light sensitive microcapsules thereon, the apparatus comprising:
    an illuminating mechanism for illuminating said photosensitive medium;
    exposure means for subjecting a same area of the photosensitive medium to exposure of light representative of the image and of light having a uniform intensity prior to pressing the transfer medium against the photosensitive medium; and
    temperature control means for maintaining the ambient temperature surrounding at least said same area of the photosensitive medium within a predetermined range to prevent the ambient temperature from adversely affecting the light sensitive microcapsules in said same area.

15. The image forming apparatus of claim 14, wherein the temperature control means includes heating means for raising said ambient temperature.

16. The image forming apparatus of claim 15, further including fixing means for permanently fixing the image on the transfer medium and which produces exhaust heat and wherein the heating means includes means for transferring the exhaust heat of the fixing means to an area surrounding said same area of the photosensitive medium to maintain said ambient temperature within said predetermined range.

17. The image forming apparatus of claim 14, wherein the temperature control means includes cooling means for lowering said ambient temperature.

18. The image forming apparatus of claim 15, wherein the temperature control means further includes cooling means.

19. The image forming apparatus of claim 15, wherein the temperature control means includes sensing means for detecting said ambient temperature and a control device for controlling the heating means based on the ambient temperature detected by said sensing means.

20. The image forming apparatus of claim 17, wherein the temperature control means includes sensing means for detecting said ambient temperature and a control device for controlling the cooling means based on the ambient temperature detected by said sensing means.

21. The image forming apparatus of claim 18, wherein the temperature control means includes sensing means for detecting said ambient temperature and a control device for controlling the heating means and cooling means based on the ambient temperature detected by said sensing means.

22. The image forming apparatus of claim 14, wherein the illuminating mechanism includes means for directly illuminating the photosensitive medium.

23. The image forming apparatus of claim 14, wherein the illuminating mechanism includes means for indirectly illuminating the photosensitive medium.

24. The image forming apparatus of claim 22, wherein the illuminating mechanism further includes means for indirectly illuminating the photosensitive medium.

25. The image forming apparatus of claim 14, wherein said same area is positioned between the exposure means and the temperature control means.

26. The image forming apparatus of claim 14, wherein the temperature control means is positioned within the exposure means.

27. A method for forming an image on a transfer medium by pressing the transfer medium against a photosensitive medium having light sensitive microcapsules thereon in combination with a light source, said method comprising:
   exposing a first predetermined region of the photosensitive medium to light representative of the image to be formed thereon;
   exposing the first predetermined region of the photosensitive medium to light having a uniform intensity prior to pressing the transfer medium against the photosensitive medium; and
   maintaining the ambient temperature surrounding at least the first predetermined region of the photosensitive medium within a predetermined range to prevent the ambient temperature from adversely affecting the light sensitive microcapsules in said first predetermined region.

28. The method of claim 27, further including exposing a second predetermined region of the photosensitive medium to light nonrepresentative of the image to be formed thereon.

29. The method of claim 27, wherein the ambient temperature is maintained by selectively cooling and heating the area surrounding said first predetermined region.

30. The method of claim 28, wherein the ambient temperature is maintained by selectively cooling and heating the areas surrounding said first and second predetermined regions.

31. An image forming apparatus for forming an image on a transfer medium by pressing the transfer medium against a photosensitive medium having light sensitive microcapsules thereon, the apparatus comprising:
   an illuminating mechanism for illuminating said photosensitive medium; and
   exposure means for subjecting a same area of the photosensitive medium to exposure of light representative of the image and of light having a uniform intensity prior to pressing the transfer medium against the photosensitive medium;
   wherein the light having a uniform intensity produced by said exposure means includes red, blue and green components, and further including adjustment means operable for adjusting each of these components.

32. The image forming apparatus of claim 31, wherein the adjustment means include red filter means, green filter means and blue filter means, each filter means having diaphragm means operable for covering at least a portion of the corresponding filter means.

33. The image forming apparatus of claim 32, wherein the portion of each filter means which is covered by a corresponding diaphragm means is based on the photosensitive medium and environmental conditions under which the apparatus operates.

* * * * *